United States Patent
Harada et al.

(10) Patent No.: US 12,144,164 B2
(45) Date of Patent: Nov. 12, 2024

(54) METHOD FOR MANUFACTURING MEMORY DEVICE USING SEMICONDUCTOR ELEMENT

(71) Applicant: Unisantis Electronics Singapore Pte. Ltd., Singapore (SG)

(72) Inventors: Nozomu Harada, Tokyo (JP); Koji Sakui, Tokyo (JP)

(73) Assignee: UNISANTIS ELECTRONICS SINGAPORE PTE. LTD., Singapore (SG)

( * ) Notice: Subject to any disclaimer, the term of this patent is extended or adjusted under 35 U.S.C. 154(b) by 398 days.

(21) Appl. No.: 17/846,319

(22) Filed: Jun. 22, 2022

(65) Prior Publication Data

US 2022/0415901 A1  Dec. 29, 2022

(30) Foreign Application Priority Data

Jun. 25, 2021 (WO) .................. PCT/JP2021/024090

(51) Int. Cl.
*H01L 21/00* (2006.01)
*H10B 12/00* (2023.01)

(52) U.S. Cl.
CPC .................. *H10B 12/01* (2023.02)

(58) Field of Classification Search
CPC ...... H10B 12/01; H10B 12/036; H10B 12/05; H10B 12/33
See application file for complete search history.

(56) References Cited

U.S. PATENT DOCUMENTS

| 11,925,013 | B2* | 3/2024 | Harada | G11C 11/4094 |
| 11,968,822 | B2* | 4/2024 | Harada | G11C 11/4096 |
| 12,096,608 | B2* | 9/2024 | Masuoka | H10K 59/121 |
| 2003/0111681 | A1 | 7/2003 | Kawanaka | |
| 2006/0049444 | A1 | 3/2006 | Shino | |
| 2006/0157738 | A1 | 7/2006 | Kawanaka | |

(Continued)

FOREIGN PATENT DOCUMENTS

| CN | 114068549 A | * 2/2022 | ....... H01L 27/10808 |
| CN | 115172378 A | * 10/2022 | ............... G11C 7/12 |

(Continued)

OTHER PUBLICATIONS

Hiroshi Takato, Kazumasa Sunouchi, Naoko Okabe, Akihiro Nitayama, Katsuhiko Hieda, Fumio Horiguchi, and Fujio Masuoka "Impact of Surrounding Gate Trannsistor (SGT) for Ultra-High Density LSI's", IEEE Transaction on Electron Devices, vol. 38, No. 3, pp. 573-578 (1991).

(Continued)

*Primary Examiner* — Laura M Menz
(74) *Attorney, Agent, or Firm* — Crowell & Moring LLP

(57) ABSTRACT

Provided is a step of forming, on a P-layer substrate 20, an N+ layer 21A to be connected to a source line SL, Si pillars 25a to 25d, N+ layers 23A to 23D to be connected to bit lines BL1 and BL2, HfO$_2$ layers 30a and 32 surrounding lower and upper portions of the Si pillars 25a to 25d, a TiN layer 31a to be connected to a plate line PL, and TiN layers 33a and 33b to be connected to word lines WL1 and WL2. P layers 27a to 27d are formed so as to surround the Si pillars 25a to 25d and so as to be deposited on them to form a plurality of dynamic flash memory cells arranged in rows and columns.

10 Claims, 15 Drawing Sheets

(56) References Cited

U.S. PATENT DOCUMENTS

| | | |
|---|---|---|
| 2008/0137394 A1 | 6/2008 | Shimano et al. |
| 2008/0212366 A1 | 9/2008 | Ohsawa |
| 2008/0239789 A1 | 10/2008 | Shino et al. |
| 2015/0325444 A1 | 11/2015 | Masuoka et al. |
| 2017/0040329 A1 | 2/2017 | Masuoka et al. |
| 2017/0301679 A1 | 10/2017 | Masuoka et al. |
| 2020/0381557 A1 | 12/2020 | Hattori et al. |
| 2022/0208254 A1* | 6/2022 | Sakui ................. G11C 11/4091 |
| 2022/0359520 A1* | 11/2022 | Harada ................ G11C 11/412 |
| 2022/0367470 A1* | 11/2022 | Harada ............... G11C 11/4096 |
| 2022/0384446 A1* | 12/2022 | Harada ................. H10B 12/33 |
| 2022/0415901 A1* | 12/2022 | Harada ................ H10B 12/036 |
| 2023/0008471 A1* | 1/2023 | Harada ............... G11C 11/4096 |
| 2023/0046352 A1* | 2/2023 | Harada ................. H10B 12/20 |
| 2023/0093308 A1* | 3/2023 | Harada ................. H10B 12/33 |
| | | 365/189.011 |
| 2023/0127781 A1* | 4/2023 | Shirota .............. H01L 29/7841 |
| | | 438/268 |
| 2023/0145678 A1* | 5/2023 | Shirota ................. H10B 12/33 |
| | | 365/129 |
| 2023/0171945 A1* | 6/2023 | Harada ................. H10B 12/20 |
| | | 257/314 |
| 2023/0178145 A1* | 6/2023 | Sakui ..................... G11C 16/24 |
| | | 365/189.011 |
| 2023/0225105 A1* | 7/2023 | Shirota ................. H10B 12/20 |
| | | 257/314 |
| 2023/0247820 A1* | 8/2023 | Kakumu ............ H01L 29/7841 |
| | | 257/314 |
| 2023/0269925 A1* | 8/2023 | Harada ................. H10B 12/20 |
| | | 438/257 |
| 2023/0301057 A1* | 9/2023 | Harada .............. H01L 29/7841 |
| 2023/0397394 A1* | 12/2023 | Harada .............. G11C 11/4096 |
| 2023/0397395 A1* | 12/2023 | Harada .............. H01L 29/1095 |
| 2024/0292593 A1* | 8/2024 | Sakui .................... H10B 12/20 |

FOREIGN PATENT DOCUMENTS

| | | |
|---|---|---|
| JP | H 02-188966 A | 7/1990 |
| JP | H 03-171768 A | 7/1991 |
| JP | 2003-188279 A | 7/2003 |
| JP | 2006-080280 A | 3/2006 |
| JP | 2008-147514 A | 6/2006 |
| JP | 3957774 B2 | 5/2007 |
| JP | 2008-124209 A | 5/2008 |
| JP | 2008-218556 A | 9/2008 |
| JP | 2020-198343 A | 12/2020 |
| WO | WO 2014/184933 A | 11/2014 |
| WO | WO-2022137607 A1 * | 6/2022 | |
| WO | WO-2022239198 A1 * | 11/2022 | ........... G11C 11/404 |
| WO | WO-2022269890 A1 * | 12/2022 | ....... H01L 27/10844 |
| WO | WO-2023281728 A1 * | 1/2023 | ........... G11C 11/404 |
| WO | WO-2023032193 A1 * | 3/2023 | ............. G11C 11/39 |
| WO | WO-2023067748 A1 * | 4/2023 | ........... G11C 11/404 |

OTHER PUBLICATIONS

H. Chung, H. Kim, H. Kim, K. Kim, S. Kim, K. W. Song, J. Kim, Y. C. Oh, Y. Hwang, H. Hong, G. Jin, and C. Chung: "Novel 4F2 DRAM Cell with Vertical Pillar Transistor (VPT)," 2011 Proceeding of the European Solid-State Device Research Conference, (2011).

H. S. Philip Wong, S. Raoux, S. Kim, Jiale Liang, J. P. Reifenberg, B. Rajendran, M. Asheghi and K. E. Goodson: "Phase Change Memory," Proceeding of IEEE, vol. 98, No. 12, December pp. 2201-2227 (2010).

K. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and High Speed Switching of Ti-doped NiO ReRAM under the Unipolar Voltage Source of less than 3V," IEDM (2007) 99. 767-770.

W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015).

M. G. Ertosun, K. Lim, C. Park, J. Oh, P. Kirsch, and K. C. Saraswat : "Novel Capacitorless Single-Transistor Charge-Trap DRAM (1T CT DRAM) Utilizing Electron," IEEE Electron Device Letter, vol. 31, No. 5, pp. 405-407 (2010).

E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, vol. 53, No. 4, pp. 692-697, Apr. 2006.

F. Morishita, H. Noda, I. Hayashi, T. Gyohten, M. Oksmoto, T. Ipposhi, S. Maegawa, K. Dosaka, and K. Arimoto: "Capacitorless Twin-Transistor Random Access Memory (TTRAM) on SOI", IEICE Trans. Electron, vol. E90-C, No. 4 pp. 765-771 (2007).

Initial Patent Examination Report (PCT/IPEA/409) (Japanese) from PCT/JP2021/024090 dated Jan. 4, 2022, 3 pgs.

\* cited by examiner

FIG. 2A  "1" WRITE STATE

FIG. 2B  "0" ERASE OPERATION

"1" WRITE OPERATION
SOURCE-SIDE IMPACT IONIZATION

"1" WRITE STATE

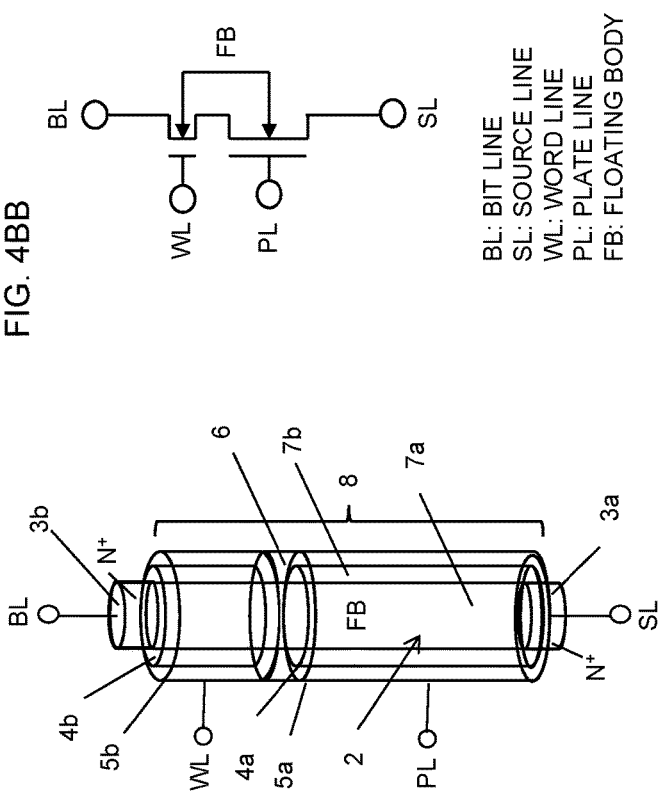
FIG. 4BA
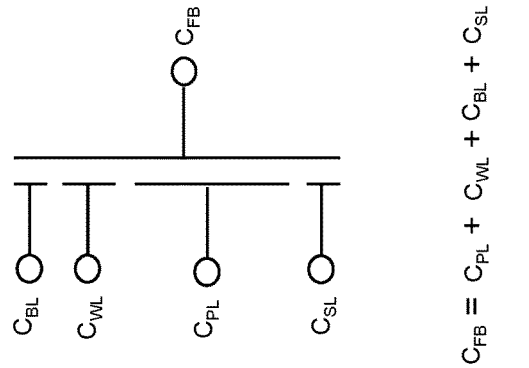
FIG. 4BB
BL: BIT LINE
SL: SOURCE LINE
WL: WORD LINE
PL: PLATE LINE
FB: FLOATING BODY
FIG. 4BC
$$C_{FB} = C_{PL} + C_{WL} + C_{BL} + C_{SL}$$
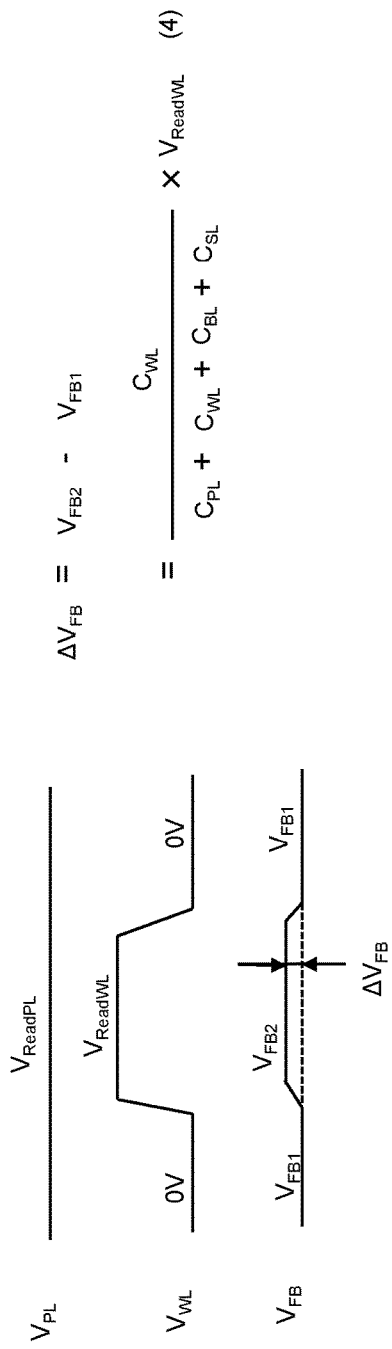
FIG. 4BD
$$\Delta V_{FB} = V_{FB2} - V_{FB1}$$
$$= \frac{C_{WL}}{C_{PL} + C_{WL} + C_{BL} + C_{SL}} \times V_{ReadWL} \quad (4)$$

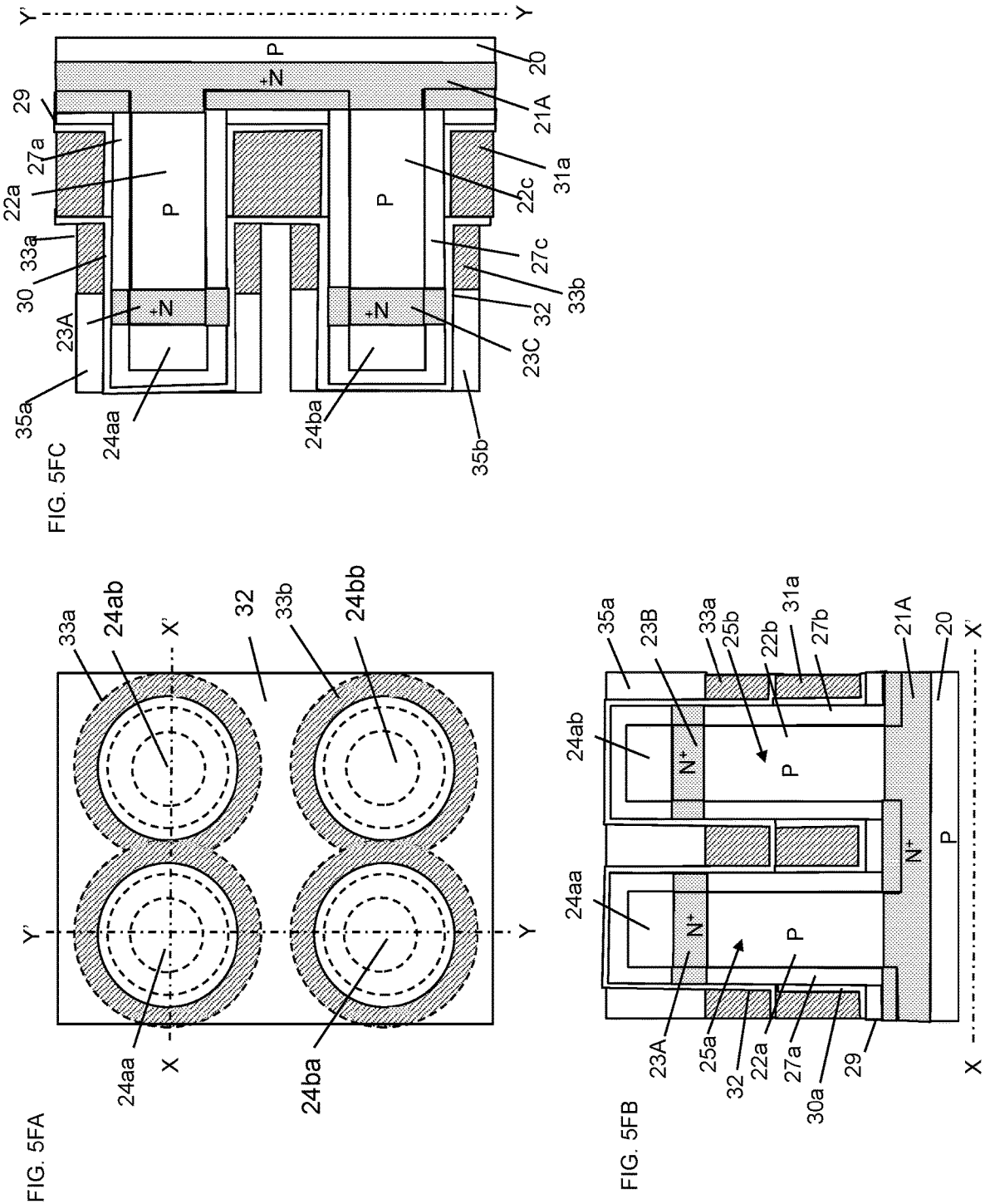

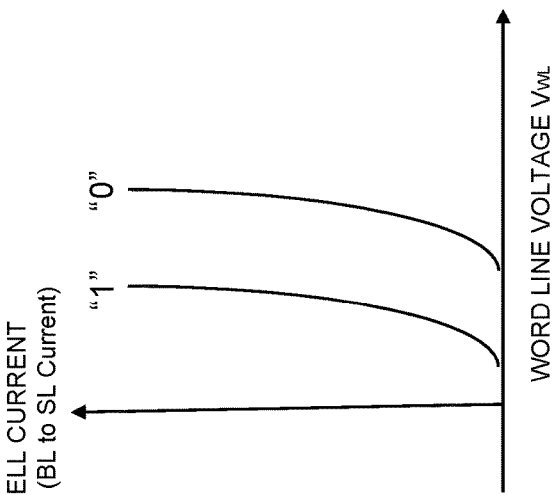
FIG. 6B
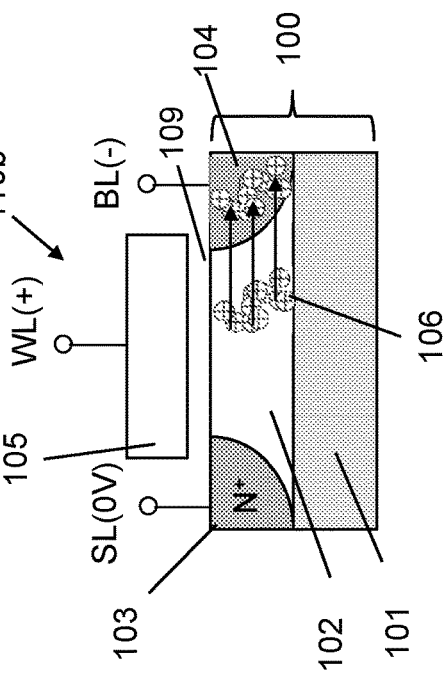
FIG. 6D
FIG. 6A
FIG. 6C $$C_{FB} = C_{WL} + C_{BL} + C_{SL} \quad \text{Equation (1)}$$

$$\Delta V_{FB} = V_{FB2} - V_{FB1}$$
$$= \frac{C_{WL}}{C_{WL} + C_{BL} + C_{SL}} \times V_{ProgWL} \quad \text{Equation (2)}$$

$$\beta = \frac{C_{WL}}{C_{WL} + C_{BL} + C_{SL}} \quad \text{Equation (3)}$$

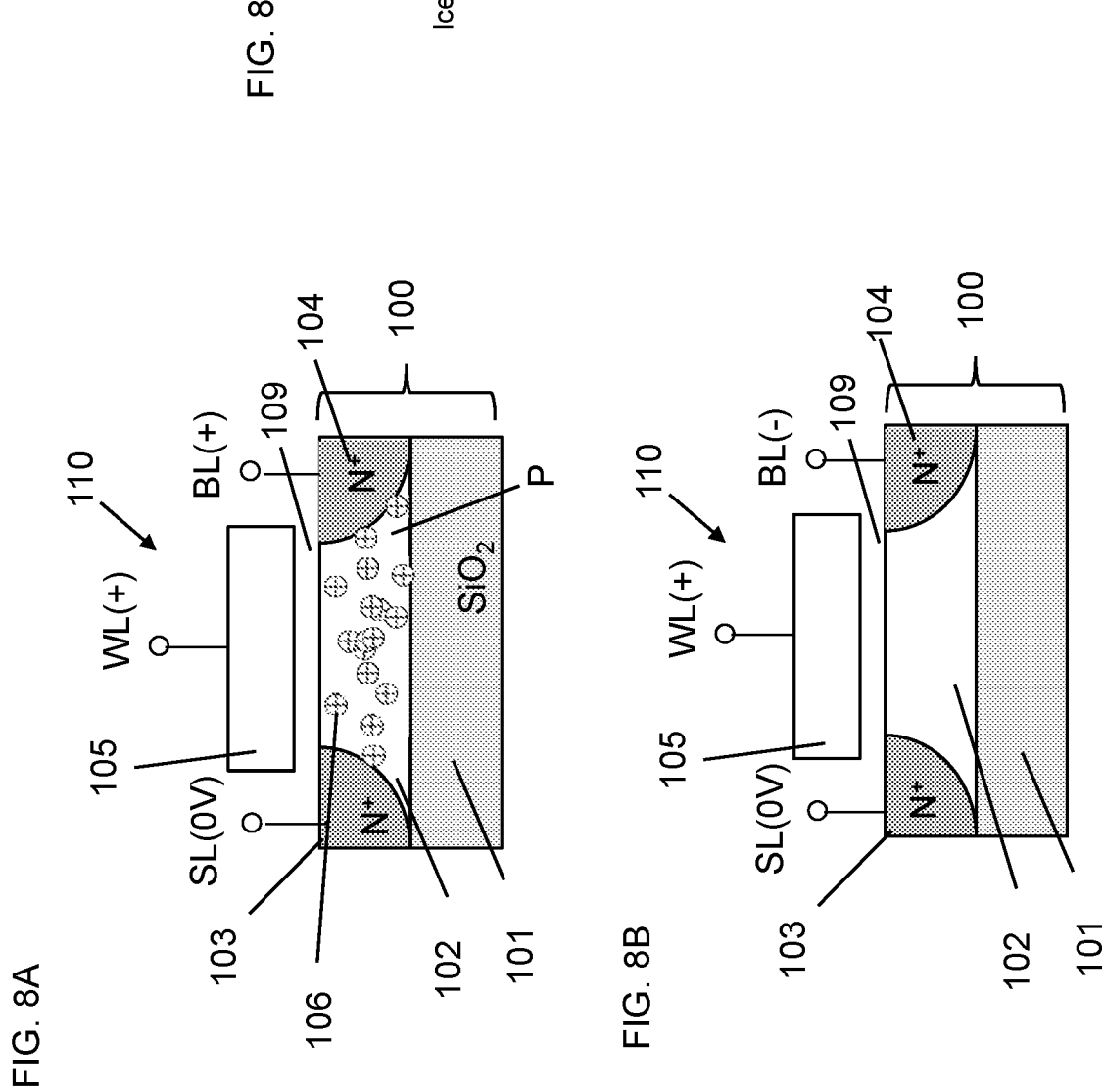

METHOD FOR MANUFACTURING MEMORY DEVICE USING SEMICONDUCTOR ELEMENT

CROSS-REFERENCE TO RELATED APPLICATIONS

This application claims priority to PCT/JP2021/024090 filed Jun. 25, 2021, the enter content of which is incorporated herein by reference.

TECHNICAL FIELD

The present invention relates to a method for manufacturing a memory device using a semiconductor element.

BACKGROUND ART

Recent development of LSI (Large Scale Integration) technology requires high integration and high performance of memory elements.

In typical planar MOS transistors, a channel extends in a horizontal direction along an upper surface of a semiconductor substrate. In contrast, a channel of SGTs extends in a direction vertical to the upper surface of the semiconductor substrate (see, for example, PTL 1 and NPL 1). This enables the SGTs to achieve a high-density semiconductor device compared with the planar MOS transistors. Such SGTs can be used as selection transistors to implement high-integration memories such as a DRAM (Dynamic Random Access Memory, see, for example, NPL 2) to which a capacitor is connected, a PCM (Phase Change Memory, see, for example, NPL 3) to which a resistance change element is connected, an RRAM (Resistive Random Access Memory, see, for example, NPL 4), and an MRAM (Magneto-resistive Random Access Memory, see, for example, NPL 5) in which a change in magnetic spin orientation is induced by current to change resistance. Further, a capacitorless DRAM memory cell (see NPL 6) constituted by a single MOS transistor, and the like are available. The present application relates to a dynamic flash memory that does not include a resistance change element or a capacitor and that can be constituted only by MOS transistors.

FIGS. 6A to 6D illustrate a write operation of the capacitorless DRAM memory cell described above, which is constituted by a single MOS transistor, FIGS. 7A and 7B illustrate a problem in operation, and FIGS. 8A to 8C illustrate a read operation (see NPL 7).

FIGS. 6A to 6D illustrate the write operation of the DRAM memory cell. FIG. 6A illustrates a "1" write state. Here, the memory cell is formed on an SOI substrate 100 and is constituted by a source N$^+$ layer 103 (semiconductor regions containing donor impurities at high concentrations are hereinafter referred to as "N$^+$ layers") to which a source line SL is connected, a drain N$^+$ layer 104 to which a bit line BL is connected, a gate conductive layer 105 to which a word line WL is connected, and a floating body 102 of a MOS transistor 110a; the capacitorless DRAM memory cell is constituted by the single MOS transistor 110a. A SiO$_2$ layer 101 of the SOI substrate 100 is immediately below and in contact with the floating body 102. To write "1" to the memory cell constituted by the single MOS transistor 110a, the MOS transistor 110a is operated in a saturation region. That is, an electron channel 107 extending from the source N$^+$ layer 103 has a pinch-off point 108 and does not reach the drain N$^+$ layer 104 to which the bit line BL is connected. When the MOS transistor 110a is operated such that the bit line BL connected to the drain N$^+$ layer 104 and the word line WL connected to the gate conductive layer 105 are both set to be at a high voltage and the gate voltage is set to about ½ of the drain voltage, the electric field strength is maximized at the pinch-off point 108 near the drain N$^+$ layer 104. As a result, accelerated electrons flowing from the source N$^+$ layer 103 toward the drain N$^+$ layer 104 collide with a Si lattice, and the kinetic energy lost at this time causes generation of electron-hole pairs (impact ionization phenomenon). Most of the generated electrons (not illustrated) reach the drain N$^+$ layer 104. A very small number of electrons, which are very hot, jump over a gate oxide film 109 and reach the gate conductive layer 105. Holes 106, which are generated at the same time, charge the floating body 102. In this case, the generated holes 106 contribute as an increment of the majority carriers because the floating body 102 is made of P-type Si. When the floating body 102 is filled with the generated holes 106 and the voltage of the floating body 102 becomes higher than that of the source N$^+$ layer 103 by Vb or more, the generated holes 106 are further discharged to the source N$^+$ layer 103. Here, Vb is the built-in voltage across a PN junction between the source N$^+$ layer 103 and the P-layer floating body 102 and is about 0.7 V. FIG. 6B illustrates a state in which the floating body 102 is charged to saturation with the generated holes 106.

Next, a "0" write operation of a memory cell 110 will be described with reference to FIG. 6C. A selected word line WL is common to the memory cell 110a for writing "1" and a memory cell 110b for writing "0", which are present randomly. FIG. 6C illustrates a state of rewriting from the "1" write state to a "0" write state. To write "0", the voltage of the bit line BL is set to a negative bias, and the PN junction between the drain N$^+$ layer 104 and the P-layer floating body 102 is forward biased. As a result, the holes 106 in the floating body 102, which are generated in advance in the previous cycle, flow into the drain N$^+$ layer 104 connected to the bit line BL. At the completion of the write operation, the following two memory cell states are obtained: the memory cell 110a filled with the generated holes 106 (FIG. 6B) and the memory cell 110b from which the generated holes 106 are injected (FIG. 6C). The floating body 102 of the memory cell 110a filled with the holes 106 has a higher potential than the floating body 102 having no generated holes. Thus, a threshold voltage of the memory cell 110a is lower than a threshold voltage of the memory cell 110b. This state is illustrated in FIG. 6D.

Next, a problem in the operation of the memory cell constituted by the single MOS transistor will be described with reference to FIGS. 7A and 7B. As illustrated in FIG. 7A, the floating body 102 has a capacitance $C_{FB}$, which is the sum of a capacitance $C_{WL}$ between the gate to which the word line WL is connected and the floating body 102, a junction capacitance $C_{SL}$ of the PN junction between the source N$^+$ layer 103 to which the source line SL is connected and the floating body 102, and a junction capacitance $C_{BL}$ of the PN junction between the drain N$^+$ layer 104 to which the bit line BL is connected and the floating body 102. The capacitance $C_{FB}$ is expressed by the following equation.

$$C_{FB}=C_{WL}+C_{BL}+C_{SL} \qquad (1)$$

Accordingly, an oscillation of a word line voltage $V_{WL}$ at the time of writing affects the voltage of the floating body 102 serving as a storage node (junction) of the memory cell. This state is illustrated in FIG. 7B. In response to an increase in the word line voltage $V_{WL}$ from 0 V to $V_{progWL}$ at the time of writing, a voltage $V_{FB}$ of the floating body 102 increases from a voltage $V_{FB1}$ in the initial state before the change in the word line voltage $V_{WL}$ to $V_{FB2}$ due to capacitive coupling with the word line WL. The amount of voltage change $\Delta V_{FB}$ is expressed by the following equation.

$$\Delta V_{FB} = V_{FB2} - V_{FB1}$$

$$= C_{WL}/(C_{WL} + C_{BL} + C_{SL}) \times V_{ProgWL} \quad (2)$$

Here, $$\beta = C_{WL}(C_{WL} + C_{BL} + C_{SL}) \quad (3)$$

$\beta$ represents a coupling ratio. In such a memory cell, the contribution ratio of $C_{WL}$ is high, and, for example, $C_{WL}$:$C_{BL}$:$C_{SL}$=8:1:1. In this case, $\beta$ is equal to 0.8. For example, when the word line WL changes from 5 V at the time of writing to 0 V after the completion of writing, the floating body 102 is subjected to an amplitude noise of $5V \times \beta = 4$ V due to the capacitive coupling between the word line WL and the floating body 102. This causes a problem that a sufficient potential difference margin is not provided between the "1" potential and the "0" potential of the floating body at the time of writing.

FIGS. 8A to 8C illustrate the read operation. FIG. 8A illustrates a "1" write state, and FIG. 8B illustrates a "0" write state. Actually, however, even if Vb is written in the floating body 102 by "1" writing, the floating body 102 is lowered to a negative bias when the word line WL returns to 0 V in response to the completion of writing. When "0" is written, the floating body 102 is lowered to a further negative bias, which makes it difficult to provide a sufficiently large potential difference margin between "1" and "0" at the time of writing, as illustrated in FIG. 8C. The small operation margin is a major problem of the DRAM memory cell. In addition, another issue is to increase the density of such DRAM memory cells.

CITATION LIST

Patent Literature

[PTL 1] Japanese Unexamined Patent Application Publication No. 2-188966
[PTL 2] Japanese Unexamined Patent Application Publication No. 3-171768
[PTL 3] Japanese Patent No. 3957774

Non Patent Literature

[NPL 1] Hiroshi Takato, Kazumasa Sunouchi, Naoko Okabe, Akihiro Nitayama, Katsuhiko Hieda, Fumio Horiguchi, and Fujio Masuoka: IEEE Transaction on Electron Devices, Vol. 38, No. 3, pp. 573-578 (1991)
[NPL 2] H. Chung, H. Kim, H. Kim, K. Kim, S. Kim, K. Dong, J. Kim, Y. C. Oh, Y. Hwang, H. Hong, G. Jin, and C. Chung: "4F2 DRAM Cell with Vertical Pillar Transistor(VPT)," 2011 Proceeding of the European Solid-State Device Research Conference, (2011)
[NPL 3] H. S. Philip Wong, S. Raoux, S. Kim, Jiale Liang, J. R. Reifenberg, B. Rajendran, M. Asheghi and K. E. Goodson: "Phase Change Memory," Proceeding of IEEE, Vol. 98, No 12, December, pp. 2201-2227 (2010)
[NPL 4] T. Tsunoda, K. Kinoshita, H. Noshiro, Y. Yamazaki, T. Iizuka, Y. Ito, A. Takahashi, A. Okano, Y. Sato, T. Fukano, M. Aoki, and Y. Sugiyama: "Low Power and high Speed Switching of Ti-doped NiO ReRAM under the Unipolar Voltage Source of less than 3V," IEDM (2007)
[NPL 5] W. Kang, L. Zhang, J. Klein, Y. Zhang, D. Ravelosona, and W. Zhao: "Reconfigurable Codesign of STT-MRAM Under Process Variations in Deeply Scaled Technology," IEEE Transaction on Electron Devices, pp. 1-9 (2015)
[NPL 6] M. G. Ertosum, K. Lim, C. Park, J. Oh, P. Kirsch, and K. C. Saraswat: "Novel Capacitorless Single-Transistor Charge-Trap DRAM (1T CT DRAM) Utilizing Electron," IEEE Electron Device Letter, Vol. 31, No. 5, pp. 405-407 (2010)
[NPL 7] E. Yoshida, and T. Tanaka: "A Capacitorless 1T-DRAM Technology Using Gate-Induced Drain-Leakage (GIDL) Current for Low-Power and High-Speed Embedded Memory," IEEE Transactions on Electron Devices, Vol. 53, No. 4, pp. 692-697, April 2006.

SUMMARY OF INVENTION

Technical Problem

A capacitorless single-transistor DRAM (gain cell) in a memory device using an SGT has a problem that oscillation of the potential of the word line at the time of reading or writing data is directly transmitted as noise to an SGT body in a floating state because the capacitive coupling between the word line and the SGT body is large. This causes a problem of erroneous reading or erroneous rewriting of stored data, and makes it difficult to put a capacitorless single-transistor DRAM (gain cell) into practical use. In addition to overcoming the problem described above, it is necessary to achieve high performance and high density of DRAM memory cells.

Solution to Problem

To address the problems described above, a method for manufacturing a memory device using a semiconductor element according to the present invention (first aspect of the invention) is a method for manufacturing a memory device that includes a first gate conductor layer, a second gate conductor layer, a first impurity layer, and a second impurity layer such that voltages to be applied to the first gate conductor layer, the second gate conductor layer, the first impurity layer, and the second impurity layer are controlled to perform a data write operation, a data read operation, and a data erase operation, the method including the steps of:

forming a first semiconductor layer standing on a substrate in a vertical direction to the substrate;
forming a second semiconductor layer surrounding the first semiconductor layer to form a first semiconductor pillar composed of the first semiconductor layer and the second semiconductor layer;
forming a first gate insulating layer surrounding a lower portion of the second semiconductor layer;
forming the first gate conductor layer so as to surround the first gate insulating layer;
removing or leaving a portion of the second semiconductor layer above the first gate conductor layer in the vertical direction;
forming a second gate insulating layer connected to the first gate insulating layer and surrounding the second semiconductor layer or an upper portion of the first semiconductor layer;
forming the second gate conductor layer so as to surround the second gate insulating layer and so as to be separated from the first gate conductor layer;

forming the first impurity layer at a bottom portion of the first semiconductor pillar before or after forming the first semiconductor pillar; and forming the second impurity layer at a top portion of the first semiconductor pillar before or after forming the first semiconductor pillar (first aspect of the invention).

A second aspect of the invention provides the method according to the first aspect of the invention described above, further including the steps of:

forming a third impurity layer on the substrate before forming the first semiconductor layer; and forming the first impurity layer by, after forming the first semiconductor pillar, diffusing majority carrier impurity atoms from the third impurity layer into the first semiconductor layer and the second semiconductor layer by a thermal process (second aspect of the invention).

A third aspect of the invention provides the method according to the first aspect of the invention described above, further including the steps of:

forming a fourth impurity layer on top of the first semiconductor layer; and forming the second impurity layer by, after forming the first semiconductor pillar, diffusing majority carrier impurity atoms from the fourth impurity layer into the first semiconductor layer and the second semiconductor layer, in a case where the second semiconductor layer is left, by a thermal process (third aspect of the invention).

A fourth aspect of the invention provides the method according to the first aspect of the invention described above, further including the step of removing part or entirety of an exposed portion of the second semiconductor layer before forming the second gate insulating layer (fourth aspect of the invention).

A fifth aspect of the invention provides the method according to the first aspect of the invention described above, in which the first semiconductor layer is formed such that the first semiconductor layer has a higher impurity concentration than the second semiconductor layer (fifth aspect of the invention).

A sixth aspect of the invention provides the method according to the first aspect of the invention described above, further including the steps of:

after forming the second gate insulating layer, forming a first conductor layer surrounding the second gate insulating layer such that an upper surface of the first conductor layer is positioned near a lower end of the second impurity layer;

forming a first mask material layer on top of the first conductor layer so as to surround at least the second impurity layer; and etching the first conductor layer by using the first mask material layer as a mask to form the second gate conductor layer (sixth aspect of the invention).

A seventh aspect of the invention provides the method according to the sixth aspect of the invention described above, further including the steps of:

forming a second conductor layer surrounding the first gate insulating layer and having an upper surface located on an upper surface of the first gate conductor layer; and etching the first conductor layer, the second gate insulating layer, and the second conductor layer by using the first mask material layer as a mask, wherein the second conductor layer subjected to etching serves as the first gate conductor layer (seventh aspect of the invention).

An eighth aspect of the invention provides the method according to the third aspect of the invention described above, further including the steps of:

forming a second mask material layer on top of the fourth impurity layer;

forming the fourth impurity layer and the first semiconductor layer by using the second mask material layer as an etching mask;

etching the second mask material layer to form a first contact hole; and forming a first conductive wiring layer connected to the second impurity layer through the first contact hole (eighth aspect of the invention).

A ninth aspect of the invention provides the method according to the first aspect of the invention described above, in which the first impurity layer is connected to a source line, the second impurity layer is connected to a bit line, the first gate conductor layer is connected to a first drive control line, and the second gate conductor layer is connected to a word line (ninth aspect of the invention).

A tenth aspect of the invention provides the method according to the first aspect of the invention described above, in which the first gate conductor layer, the second gate conductor layer, the first impurity layer, and the second impurity layer are formed such that the data write operation for holding, in the first semiconductor pillar, a hole group or an electron group serving as majority carriers in the first semiconductor pillar is performed, the hole group or the electron group being formed by an impact ionization phenomenon or a gate induced drain leakage current, and such that the voltages to be applied to the first gate conductor layer, the second gate conductor layer, the first impurity layer, and the second impurity layer are controlled to perform the data erase operation for discharging the hole group or the electron group serving as the majority carriers in the first semiconductor pillar from within the first semiconductor pillar (tenth aspect of the invention).

BRIEF DESCRIPTION OF DRAWINGS

FIGS. 2A, 2B, and 2C are diagrams for describing an erase operation mechanism of the memory device including an SGT according to the first embodiment.

FIGS. 4BA, 4BB, 4BC, and 4BD are diagrams for describing the read operation mechanism of the memory device including an SGT according to the first embodiment.

FIGS. 5FA, 5FB, and 5FC are structural diagrams illustrating the method for manufacturing the memory device including an SGT according to the first embodiment.

FIGS. 6A, 6B, 6C, and 6D are diagrams illustrating a write operation of a capacitorless DRAM memory cell of the related art.

FIGS. 8A, 8B, and 8C are diagrams illustrating a read operation of the capacitorless DRAM memory cell of the related art.

DESCRIPTION OF EMBODIMENTS

Hereinafter, the structure of a memory device using a semiconductor element (hereinafter referred to as a dynamic flash memory) according to the present invention, a driving method thereof, and a method for manufacturing the memory device will be described with reference to the drawings.

First Embodiment

The structure and operation mechanism of a dynamic flash memory cell according to a first embodiment of the present invention, and a method for manufacturing the dynamic flash memory cell will be described with reference to FIGS. 1 to 5GC. The structure of the dynamic flash memory cell will be described with reference to FIG. 1. A data erase operation mechanism will be described with reference to FIGS. 2A to 2C, a data write operation mechanism will be described with reference to FIGS. 3A to 3C, and a data read operation mechanism will be described with reference to FIGS. 4AA to 4AC and FIGS. 4BA to 4BD. A method for manufacturing a dynamic flash memory will be described with reference to FIGS. 5AA to 5GC.

Figure 1:
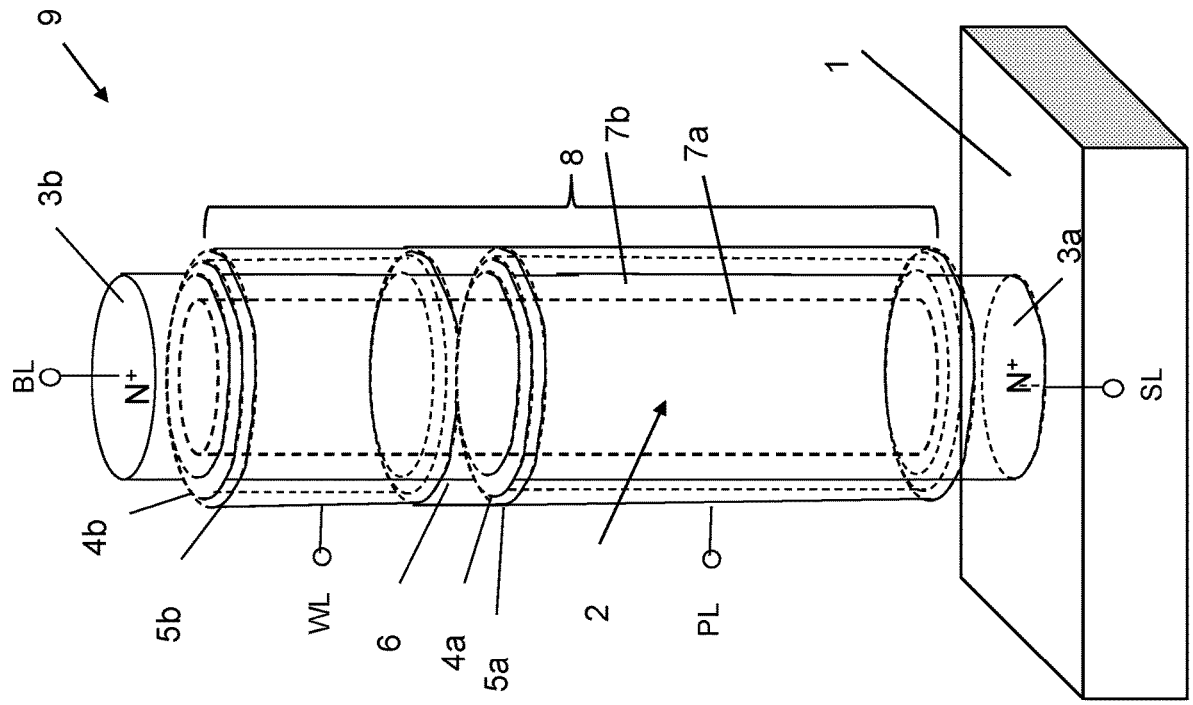
FIG. 1 is a structural diagram of a memory device including an SGT according to a first embodiment.

FIG. 1 illustrates the structure of the dynamic flash memory cell according to the first embodiment of the present invention. A substrate 1 (an example of a "substrate" in the claims) has thereon an $N^+$ layer 3a (an example of a "first impurity layer" in the claims). The $N^+$ layer 3a has thereon a silicon semiconductor pillar 2 (an example of a "first semiconductor pillar" in the claims) (silicon semiconductor pillars are hereinafter referred to as "Si pillars"). The Si pillar 2 has a P layer 7a (an example of a "first semiconductor layer" in the claims) (a semiconductor region containing an acceptor impurity is hereinafter referred to as "P layer") in a central portion thereof in plan view, and a P layer 7b (an example of a "second semiconductor layer" in the claims) surrounding the P layer 7a. The Si pillar 2 has thereon an $N^+$ layer 3b (an example of a "second impurity layer" in the claims). A portion of the Si pillar 2 between the $N^+$ layers 3a and 3b serves as a channel region 8. A first gate insulating layer 4a (an example of a "first gate insulating layer" in the claims) surrounds a lower portion of the Si pillar 2, and a second gate insulating layer 4b (an example of a "second gate insulating layer" in the claims) surrounds an upper portion of the Si pillar 2. A first gate conductor layer 5a (an example of a "first gate conductor layer" in the claims) surrounds the first gate insulating layer 4a, and a second gate conductor layer 5b (an example of a "second gate conductor layer" in the claims) surrounds the second gate insulating layer 4b. The first gate conductor layer 5a and the second gate conductor layer 5b are isolated from each other by an insulating layer 6. Accordingly, a dynamic flash memory cell 9 composed of the $N^+$ layers 3a and 3b, the P layers 7a and 7b, the first gate insulating layer 4a, the second gate insulating layer 4b, the first gate conductor layer 5a, and the second gate conductor layer 5b is formed.

As illustrated in FIG. 1, the $N^+$ layer 3a is connected to a source line SL (an example of a "source line" in the claims), the $N^+$ layer 3b is connected to a bit line BL (an example of a "bit line" in the claims), the first gate conductor layer 5a is connected to a plate line PL (an example of a "first drive control line" in the claims), and the second gate conductor layer 5b is connected to a word line WL (an example of a "word line" in the claims). It is desirable to achieve a structure in which the first gate conductor layer 5a connected to the plate line PL has a larger gate capacitance than the second gate conductor layer 5b connected to the word line WL. In the memory device, a plurality of dynamic flash memory cells, each of which is described above, are two-dimensionally arranged on the substrate 1.

It is desirable that the P layer 7b surrounding the P layer 7a be at least in a portion surrounded by the first gate insulating layer 4a. A portion surrounded by the second gate insulating layer 4b may or may not include the P layer 7b. The P layer 7a may be set to have a higher acceptor impurity concentration than the P layer 7b.

In FIG. 1, the first gate conductor layer 5a connected to the plate line PL has a longer gate length than the second gate conductor layer 5b connected to the word line WL so that the gate capacitance of the first gate conductor layer 5a can be larger than the gate capacitance of the second gate conductor layer 5b. Alternatively, a gate insulating film of the first gate insulating layer 4a may have a smaller thickness than a gate insulating film of the second gate insulating layer 4b instead of the first gate conductor layer 5a having a longer gate length than the second gate conductor layer 5b. Alternatively, the first gate insulating layer 4a may have a higher dielectric constant than the second gate insulating layer 4b. Further, any of the lengths of the gate conductor layers 5a and 5b, the thicknesses of the gate insulating layers 4a and 4b, and the dielectric constants of the gate insulating layers 4a and 4b may be combined so that the gate capacitance of the first gate conductor layer 5a can be larger than the gate capacitance of the second gate conductor layer 5b.

Alternatively, the first gate conductor layer 5a may be divided into two or more portions, which are operated synchronously or asynchronously as conductive electrodes for plate lines. Likewise, the second gate conductor layer 5b may be divided into two or more portions, which are operated synchronously or asynchronously as conductive electrodes for word lines. This also allows a dynamic flash memory operation to be performed.

Figure 2C:
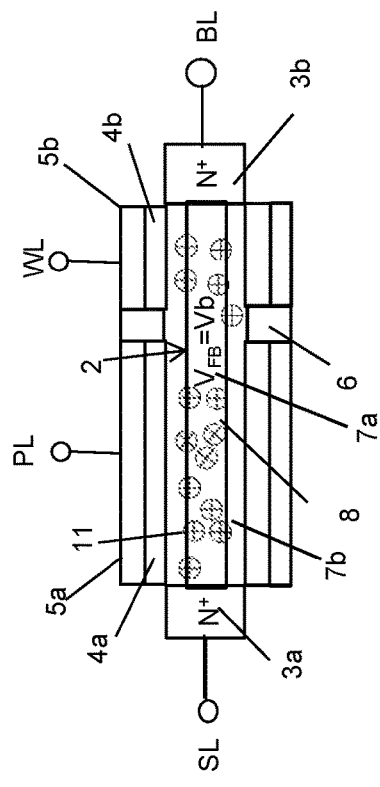
Figure 2C:
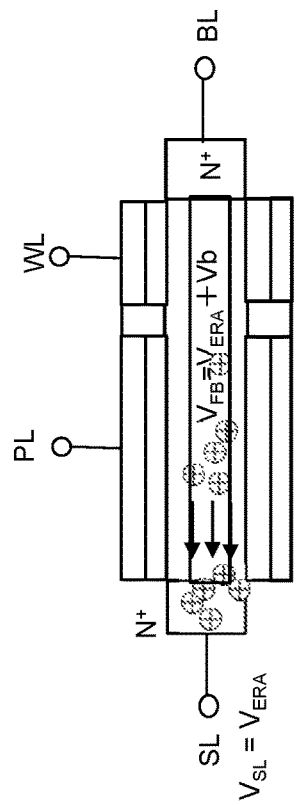
Figure 2C:
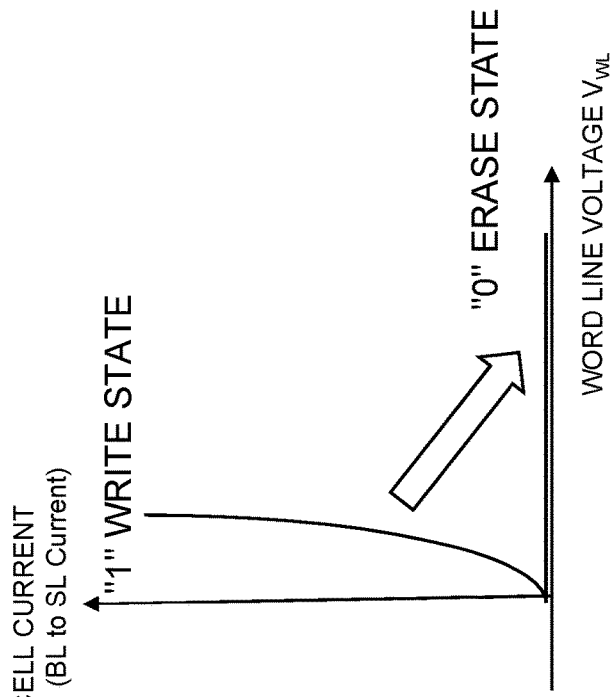

An erase operation mechanism will be described with reference to FIGS. 2A to 2C. The channel region 8 between the $N^+$ layers 3a and 3b is electrically isolated from the substrate 1 and serves as a floating body. The channel region 8 is composed of the P layers 7a and 7b, as described with reference to FIG. 1. FIG. 2A illustrates a state in which a hole group 11 generated by impact ionization in the previous cycle is stored in the channel region 8 before an erase operation is performed. The hole group 11 is mainly accumulated in the P layer 7a. At the time of the erase operation, as illustrated in FIG. 2B, the voltage of the source line SL is set to a negative voltage $V_{ERA}$. Here, $V_{ERA}$ is −3 V, for example. As a result, the PN junction between the channel region 8 and the N+ layer 3a serving as the source to which the source line SL is connected is forward biased regardless of the value of an initial potential of the channel region 8. As a result, the hole group 11 stored in the channel region 8, which is generated by impact ionization in the previous cycle, is drawn into the N+ layer 3a corresponding to the source portion, and the channel region 8 has a potential $V_{FB}$, which is given by $V_{FB}=V_{ERA}+Vb$. Here, Vb is the built-in voltage across the PN junction and is about 0.7 V. When $V_{ERA}=-3$ V, the potential of the channel region 8 is −2.3 V. This value corresponds to the potential state of the channel region 8 in an erase state. If the potential of the channel region 8 serving as the floating body becomes a negative voltage, the threshold voltage of an N-channel MOS transistor of the dynamic flash memory cell 9 increases due to a substrate bias effect. This increases the threshold voltage of the second gate conductor layer 5b to which the word line WL is connected, as illustrated in FIG. 2C. The erase state of the channel region 8 corresponds to logical storage data "0". In data reading, the voltage to be applied to the first gate conductor layer 5a connected to the plate line PL is set to be higher than the threshold voltage at the time of logical storage data "1" and lower than the threshold voltage at the time of logical storage data "0", whereby a characteristic is obtained in which, as illustrated in FIG. 2C, no current flows even when the voltage of the word line WL is increased in reading of the logical storage data "0". The condition of the voltages to be applied to the bit line BL, the source line SL, the word line WL, and the plate line PL, described above, and the potential of the floating body are an example for performing the erase operation, and other operation conditions under which the erase operation can be performed may be used. For example, a voltage difference may be applied between the bit line BL and the source line SL to cause a current to flow in the channel region 8, and electron-hole recombination generated at this time may be utilized to the erase operation.

Figure 3A:
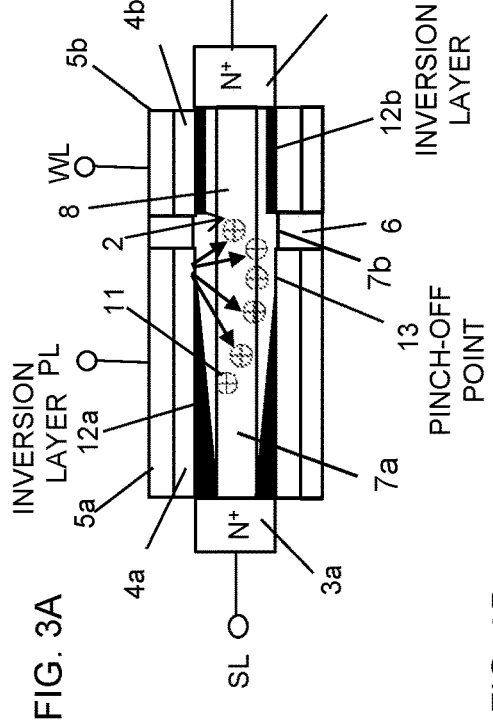
FIGS. 3A, 3B, and 3C are diagrams for describing a write operation mechanism of the memory device including an SGT according to the first embodiment.
Figure 3C:
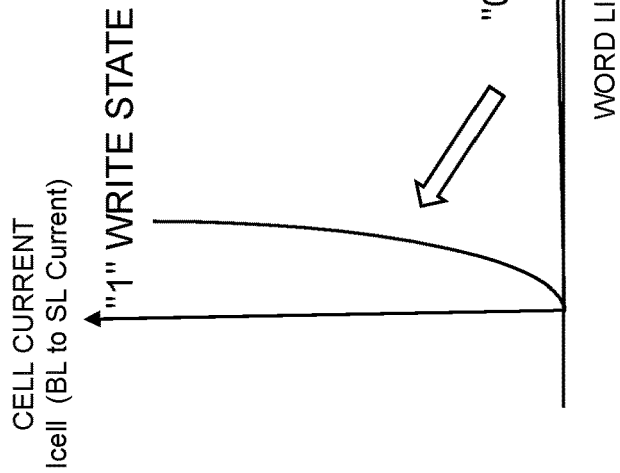
Figure 3B:
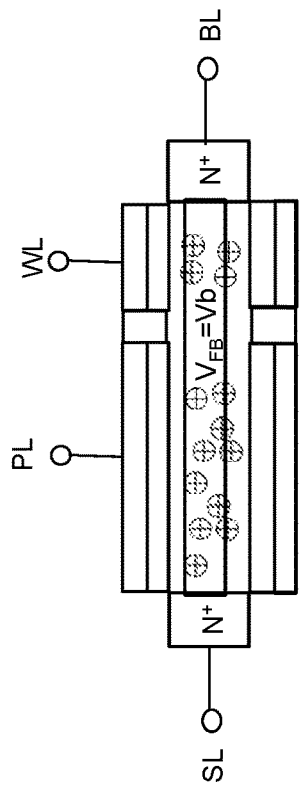

FIGS. 3A to 3C illustrate a write operation mechanism of the dynamic flash memory cell according to the first embodiment of the present invention. As illustrated in FIG. 3A, for example, 0 V is input to the N+ layer 3a to which the source line SL is connected, for example, 3 V is input to the N+ layer 3b to which the bit line BL is connected, for example, 2 V is input to the first gate conductor layer 5a to which the plate line PL is connected, and, for example, 5 V is input to the second gate conductor layer 5b to which the word line WL is connected. As a result, as illustrated in FIG. 3A, an annular inversion layer 12a is mainly formed on the P layer 7b in the channel region 8 inside the first gate conductor layer 5a to which the plate line PL is connected, and a first N-channel MOS transistor region covered by the first gate conductor layer 5a and composed of the channel region 8 is operated in a saturation region. This results in generation of a pinch-off point 13 in the inversion layer 12a on the inner side of the first gate conductor layer 5a to which the plate line PL is connected. In contrast, a second N-channel MOS transistor region including the second gate conductor layer 5b to which the word line WL is connected is operated in a linear region. This results in formation of an inversion layer 12b, without a pinch-off point, over an entire surface of the channel region 8 inside the second gate conductor layer 5b to which the word line WL is connected. The inversion layer 12b formed over the entire inner side of the second gate conductor layer 5b to which the word line WL is connected serves as a substantial drain of the first N-channel MOS transistor region including the first gate conductor layer 5a. As a result, the electric field is maximized in a first boundary region of the channel region 8 between the first N-channel MOS transistor region including the first gate conductor layer 5a and the second N-channel MOS transistor region including the second gate conductor layer 5b, which are connected in series, and an impact ionization phenomenon occurs in this region. This region is a source-side region viewed from the second N-channel MOS transistor region including the second gate conductor layer 5b to which the word line WL is connected, and thus this phenomenon is referred to as a source-side impact ionization phenomenon. The source-side impact ionization phenomenon causes electrons to flow from the N+ layer 3a to which the source line SL is connected toward the N+ layer 3b to which the bit line BL is connected. The accelerated electrons collide with lattice Si atoms, and the kinetic energy of the collision generates electron-hole pairs. Some of the generated electrons flow to the first gate conductor layer 5a and the second gate conductor layer 5b, but most of them flow to the N+ layer 3b to which the bit line BL is connected. In "1" writing, electron-hole pairs may be generated using a gate induced drain leakage (GIDL) current, and the floating body FB (see FIG. 4BA) may be filled with the generated hole group (see, for example, NPL 7). The write operation may be performed by a bipolar operation.

As illustrated in FIG. 3B, the generated hole group 11, which is majority carriers in the channel region 8, charges the channel region 8 to a positive bias. Since the N+ layer 3a to which the source line SL is connected is at 0 V, the channel region 8 is charged to the built-in voltage Vb (about 0.7 V) of the PN junction between the channel region 8 and the N+ layer 3a to which the source line SL is connected. Upon the channel region 8 being charged to a positive bias, the threshold voltages of the first N-channel MOS transistor region and the second N-channel MOS transistor region are decreased due to the substrate bias effect. This results in a decrease in the threshold voltage of the second N-channel MOS transistor region to which the word line WL is connected, as illustrated in FIG. 3C. The write state of the channel region 8 is assigned to the logical storage data "1". The generated hole group 11 is mainly stored in the P layer 7a. As a result, a stable substrate bias effect can be obtained.

At the time of the write operation, electron-hole pairs may be generated by the impact ionization phenomenon or the GIDL current in a second boundary region between the N+ layer 3a and the channel region 8 or in a third boundary region between the N+ layer 3b and the channel region 8, instead of in the first boundary region described above, and the channel region 8 may be charged with the generated hole group 11. The condition of the voltages to be applied to the bit line BL, the source line SL, the word line WL, and the plate line PL, described above, is an example for performing the write operation, and other operation conditions under which the write operation can be performed may be used.

Figure 4A:
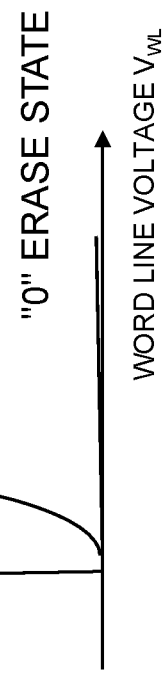
FIGS. 4AA, 4AB, and 4AC are diagrams for describing a read operation mechanism of the memory device including an SGT according to the first embodiment.
Figure 4A:
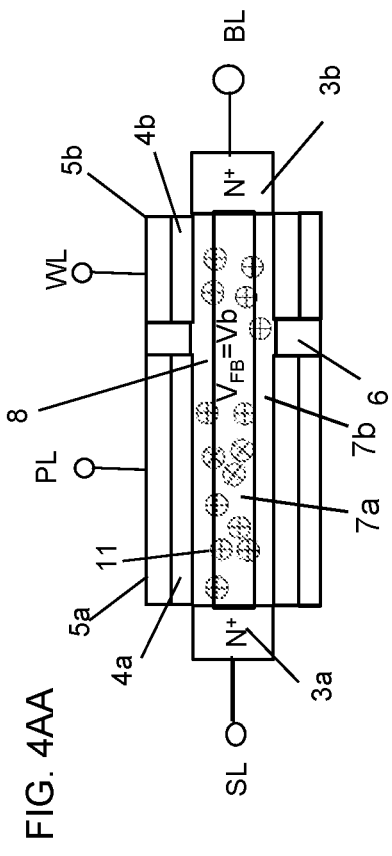
Figure 4A:
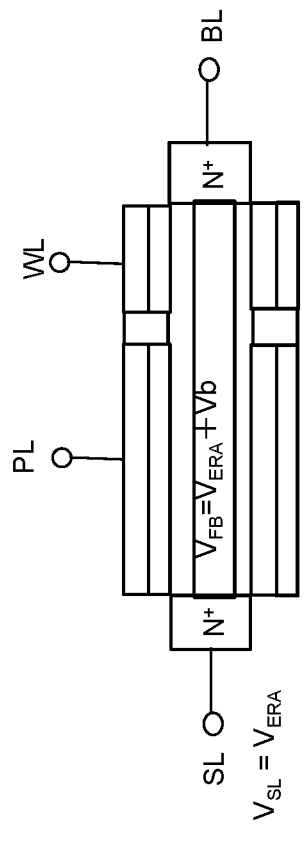

A data read operation of the dynamic flash memory cell according to the first embodiment of the present invention will be described with reference to FIGS. 4AA to 4AC and FIGS. 4BA to 4BD. The read operation of the dynamic flash memory cell will be described with reference to FIG. 4AA to FIG. 4AC. As illustrated in FIG. 4AA, upon the channel region 8 being charged to the built-in voltage Vb (about 0.7 V), the threshold voltages of the N-channel MOS transistors are decreased due to the substrate bias effect. This state is assigned to the logical storage data "1". As illustrated in FIG. 4AB, when the memory block to be selected before writing is performed is in the erase state "0" in advance, the channel region 8 is at a floating voltage $V_{FB}$, which is given by $V_{ERA}$+Vb. Through the write operation, the write state "1" is stored randomly. As a result, logical storage data of logic "0" and "1" is created for the word line WL. As illustrated in FIG. 4AC, the difference between the two threshold voltages for the word line WL is used to perform reading by using a sense amplifier.

Referring to FIG. 4BA to FIG. 4BD, a description will be given of the magnitude relationship of the gate capacitance between the two gate conductor layers, namely, the first gate conductor layer 5a and the second gate conductor layer 5b, at the time of the read operation of the dynamic flash memory cell according to the first embodiment of the present invention, and the operation related thereto. The gate capacitance of the second gate conductor layer 5b to which the word line WL is connected is desirably designed to be smaller than the gate capacitance of the first gate conductor layer 5a to which the plate line PL is connected. As illustrated in FIG. 4BA, the vertical length of the first gate conductor layer 5a to which the plate line PL is connected is set to be longer than the vertical length of the second gate conductor layer 5b to which the word line WL is connected to make the gate capacitance of the second gate conductor layer 5b to which the word line WL is connected smaller than the gate capacitance of the first gate conductor layer 5a to which the plate line PL is connected. FIG. 4BB illustrates an equivalent circuit of one cell of the dynamic flash memory illustrated in FIG. 4BA. FIG. 4BC illustrates a coupling capacitance relationship of the dynamic flash memory. Here, $C_{WL}$ is the capacitance of the second gate conductor layer 5b, $C_{PL}$ is the capacitance of the first gate conductor layer 5a, $C_{BL}$ is the capacitance of the PN junction between the channel region 8 and the N$^+$ layer 3b serving as the drain, and $C_{SL}$ is the capacitance of the PN junction between the channel region 8 and the N$^+$ layer 3a serving as the source. As illustrated in FIG. 4BD, an oscillation of the voltage of the word line WL affects the channel region 8 as noise. A potential variation $\Delta V_{FB}$ of the channel region 8 at this time is expressed by the following equation.

$$\Delta V_{FB} = C_{WL}/(C_{PL}+C_{WL}+C_{BL}+C_{SL}) = V_{ReadWL} \quad (4)$$

Here, $V_{ReadWL}$ is the oscillating potential of the word line WL at the time of reading. As apparent from Equation (4), a reduction in the contribution ratio of OWL compared with the total capacitance $C_{PL}+C_{WL}+C_{BL}+C_{SL}$ of the channel region 8 decreases $\Delta V_{FB}$. The vertical length of the first gate conductor layer 5a to which the plate line PL is connected may further be set to be longer than the vertical length of the second gate conductor layer 5b to which the word line WL is connected to further decrease $\Delta V_{FB}$ without reducing the degree of integration of memory cells in plan view. The condition of the voltages to be applied to the bit line BL, the source line SL, the word line WL, and the plate line PL, described above, and the potential of the floating body are an example for performing the read operation, and other operation conditions under which the read operation can be performed may be used.

Figure 5A:
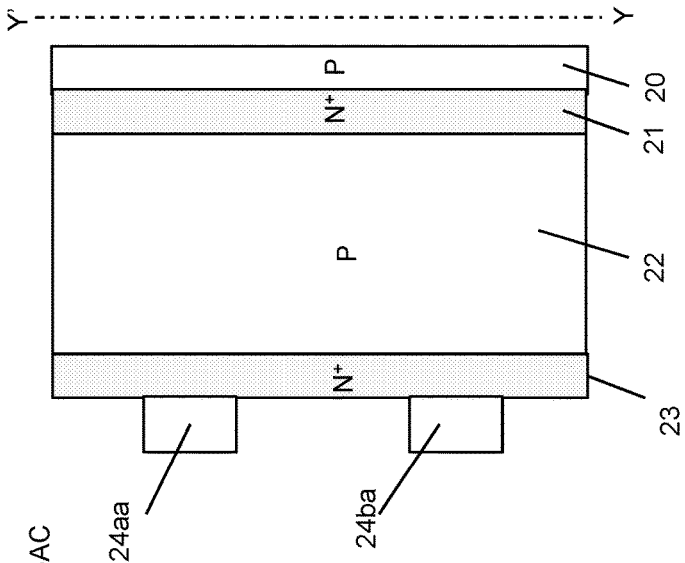
FIGS. 5AA, 5AB, and 5AC are structural diagrams illustrating a method for manufacturing the memory device including an SGT according to the first embodiment.
Figure 5A:
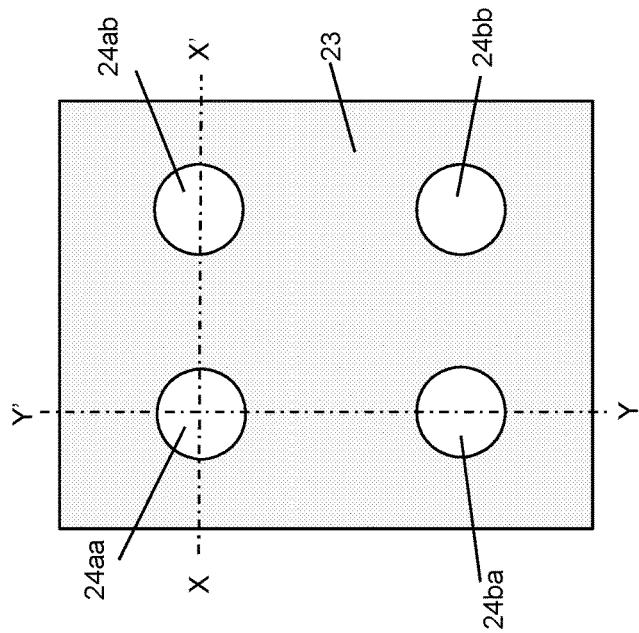
Figure 5A:
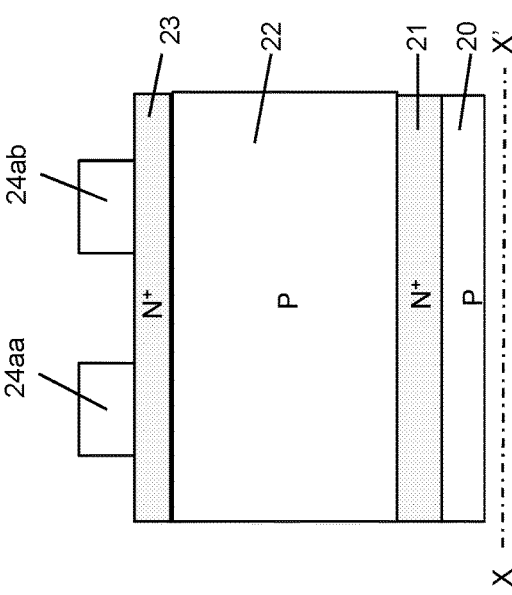

FIGS. 5AA to 5GC illustrate a method for manufacturing the dynamic flash memory according to the first embodiment. FIG. 5AA, FIG. 5BA, FIG. 5CA, FIG. 5DA, FIG. 5EA, FIG. 5FA, and FIG. 5GA are plan views of a dynamic flash memory cell. FIG. 5AB, FIG. 5BB, FIG. 5CB, FIG. 5DB, FIG. 5EB, FIG. 5FB, and FIG. 5GB are vertical cross-sectional views taken along line X-X' in FIG. 5AA, FIG. 5BA, FIG. 5CA, FIG. 5DA, FIG. 5EA, FIG. 5FA, and FIG. 5GA, respectively. FIG. 5AC, FIG. 5BC, FIG. 5CC, FIG. 5DC, FIG. 5EC, FIG. 5FC, and FIG. 5GC are vertical cross-sectional views taken along line Y-Y' in FIG. 5AA, FIG. 5BA, FIG. 5CA, FIG. 5DA, FIG. 5EA, FIG. 5FA, and FIG. 5GA, respectively. In an actual dynamic flash memory device, a large number of dynamic flash memory cells are formed so as to be two-dimensionally arranged.

As illustrated in FIGS. 5AA to 5AC, an N$^+$ layer 21 (an example of a "third impurity layer" in the claims), a P layer 22, and an N$^+$ layer 23 (an example of a "fourth impurity layer" in the claims) are formed on top of a P-layer substrate 20 (an example of a "substrate" in the claims) from bottom to top by, for example, epitaxial crystal growth. Then, mask material layers 24aa, 24ab, 24ba, and 24bb each having a circular shape in plan view are formed on top of the N$^+$ layer 23. The mask material layers 24aa to 24bb may be formed of a plurality of material layers.

Figure 5B:
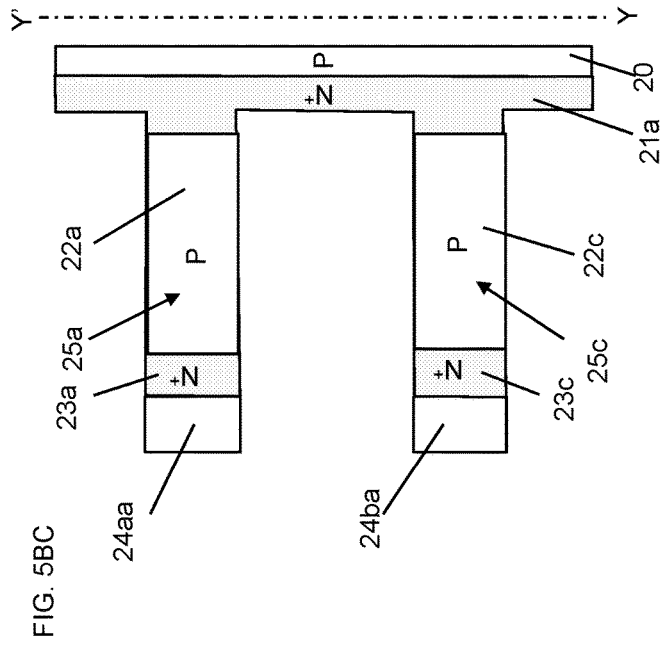
FIGS. 5BA, 5BB, and 5BC are structural diagrams illustrating the method for manufacturing the memory device including an SGT according to the first embodiment.
Figure 5B:
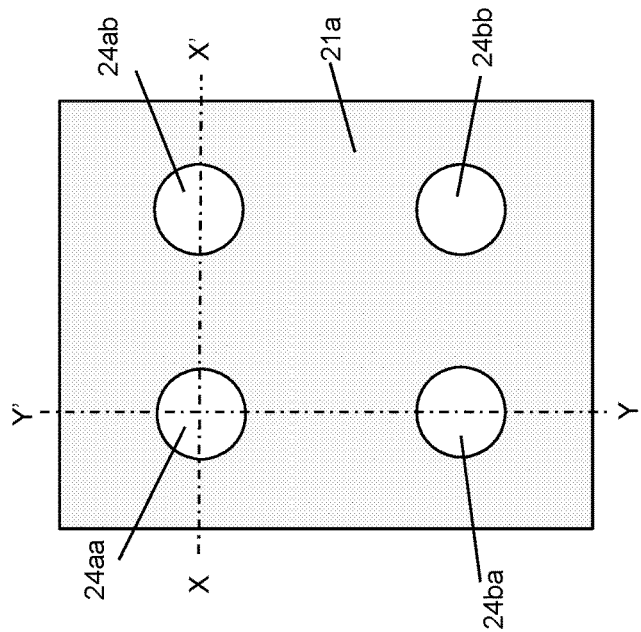
Figure 5B:
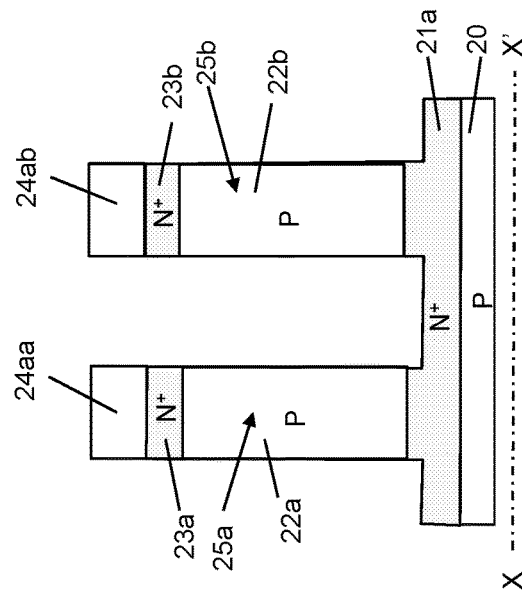

Then, as illustrated in FIGS. 5BA to 5BC, the N$^+$ layer 23, the P layer 22, and an upper portion of the N$^+$ layer 21 are etched by using the mask material layers 24aa to 24bb (examples of a "second mask material layer" in the claims) as a mask to form Si pillars 25a, 25b, 25c, and 25d (not illustrated) composed of an N$^+$ layer 21a, P layers 22a (an example of a "first semiconductor layer" in the claims), 22b, 22c, and 22d, and N$^+$ layers 23a, 23b, 23c, and 23d. In this etching, the upper portions of the mask material layers 24aa to 24bb are etched.

Figure 5C:
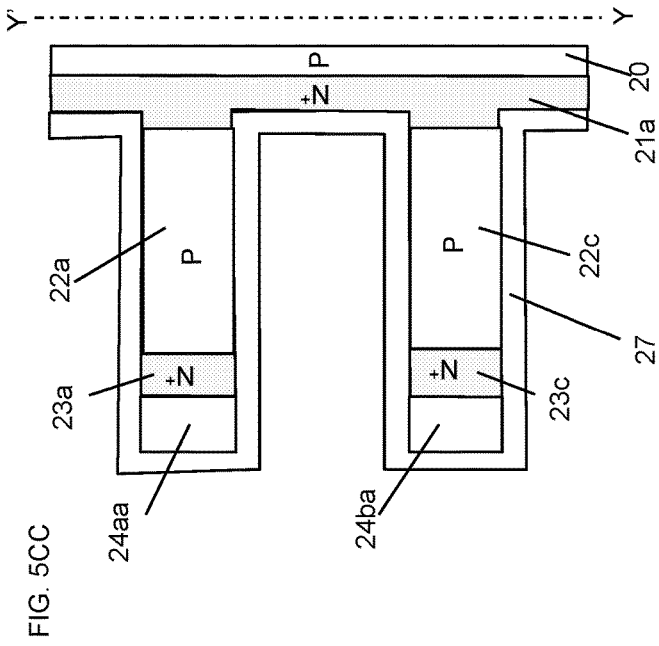
FIGS. 5CA, 5CB, and 5CC are structural diagrams illustrating the method for manufacturing the memory device including an SGT according to the first embodiment.
Figure 5C:
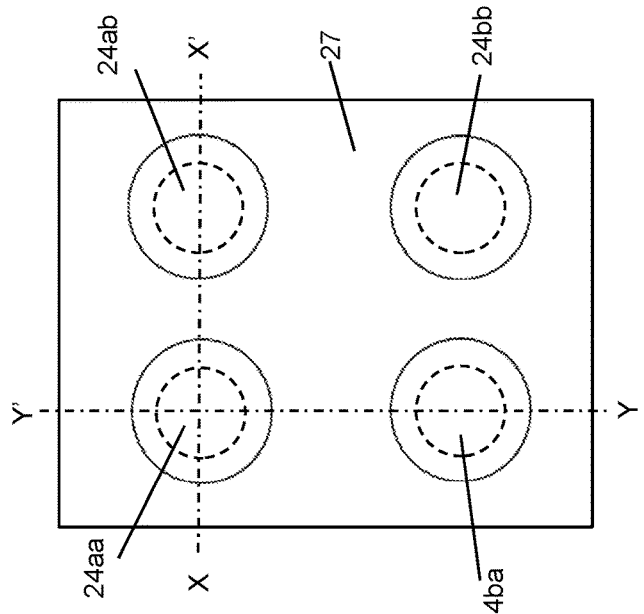
Figure 5C:
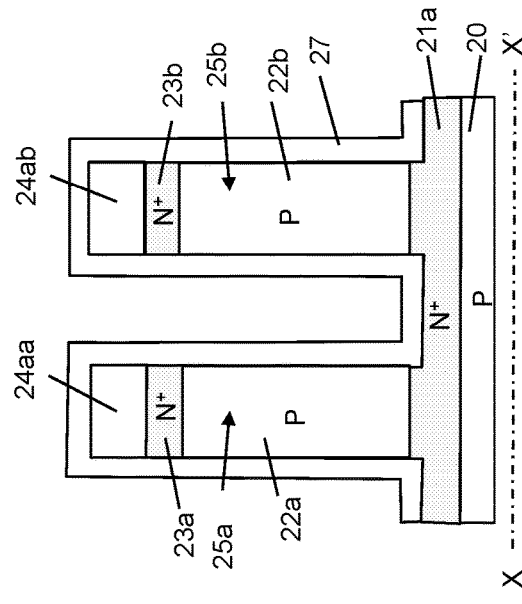

Then, as illustrated in FIGS. 5CA to 5CC, a P layer 27 of Si is formed on the entire surface by using, for example, an ALD (Atomic Layer Deposition) method.

Figure 5D:
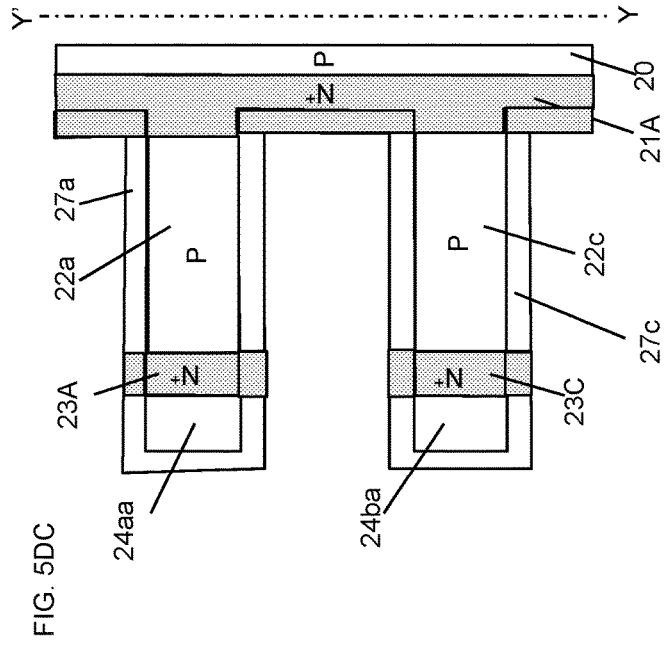
FIGS. 5DA, 5DB, and 5DC are structural diagrams illustrating the method for manufacturing the memory device including an SGT according to the first embodiment.
Figure 5D:
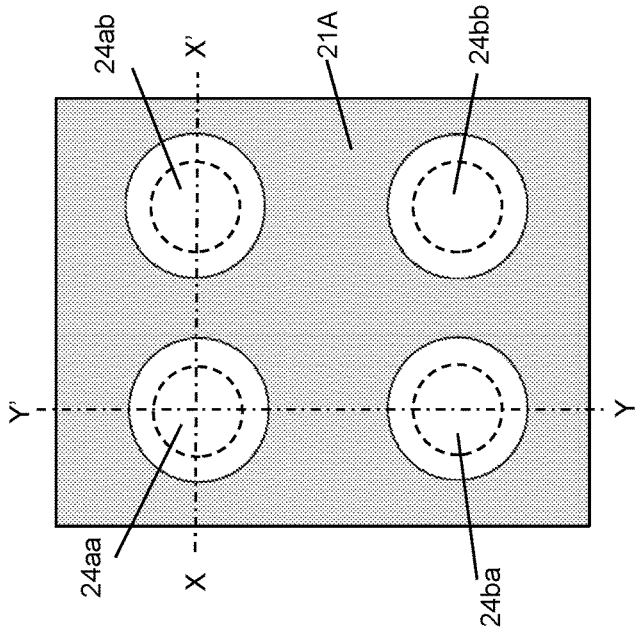
Figure 5D:
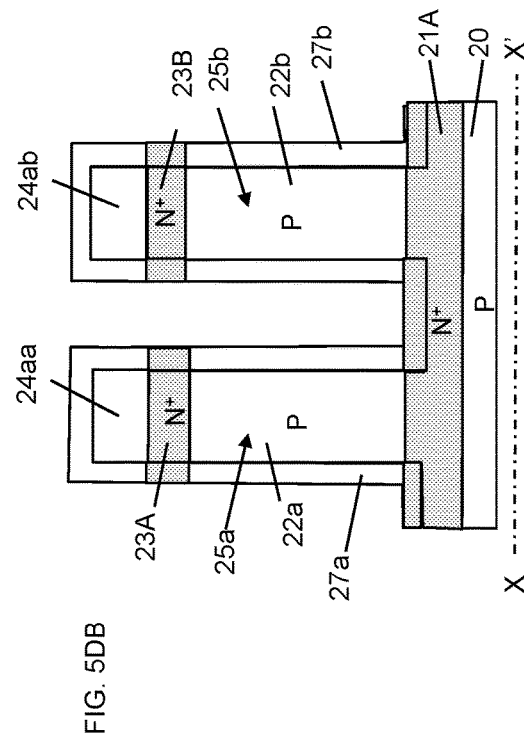

Next, as illustrated in FIGS. 5DA to 5DC, heat treatment is performed, and a donor impurity is diffused from the N$^+$ layers 21a and 23a to 23d into the P layer 27 to form N$^+$ layers 21A (an example of a "first impurity layer" in the claims), 23A (an example of a "second impurity layer" in the claims), 23B, 23C, and 23D (not illustrated). As a result, P layers 27a (an example of a "second semiconductor layer" in the claims), 27b, 27c, and 27d (not illustrated) are formed so as to surround the P layers 22a to 22d. A portion composed of the P layer 22a and the P layer 27a is an example of a "first semiconductor pillar" in the claims.

Figure 5E:
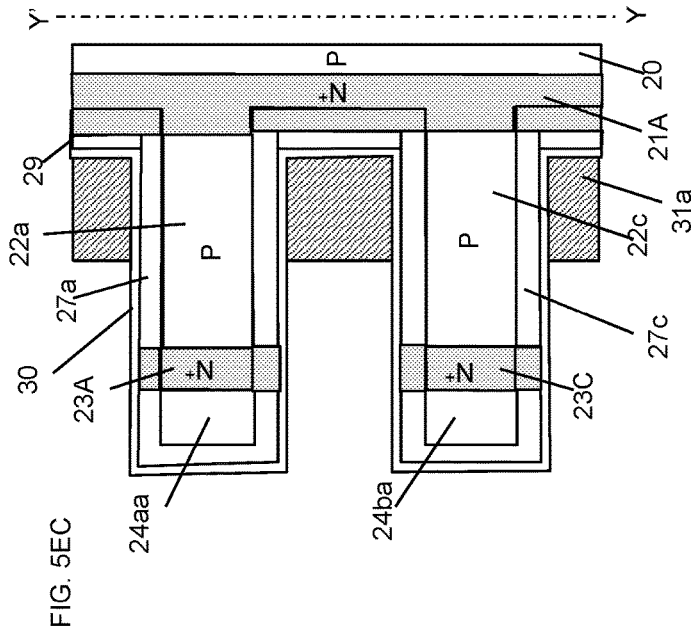
FIGS. 5EA, 5EB, and 5EC are structural diagrams illustrating the method for manufacturing the memory device including an SGT according to the first embodiment.
Figure 5E:
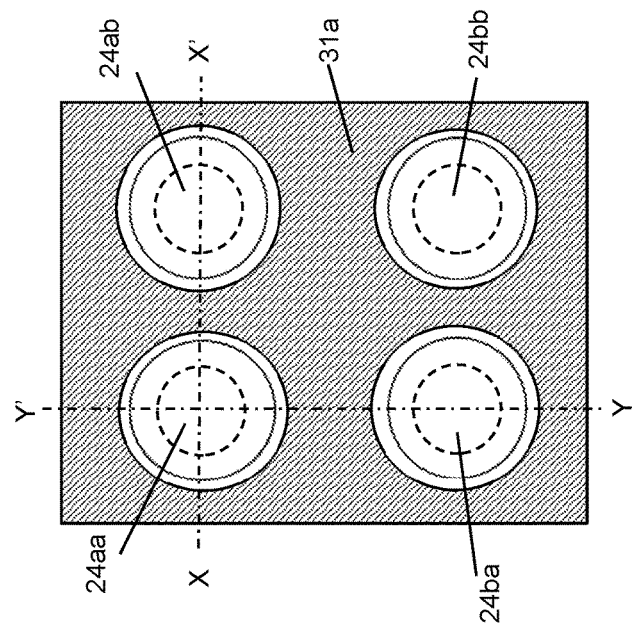
Figure 5E:
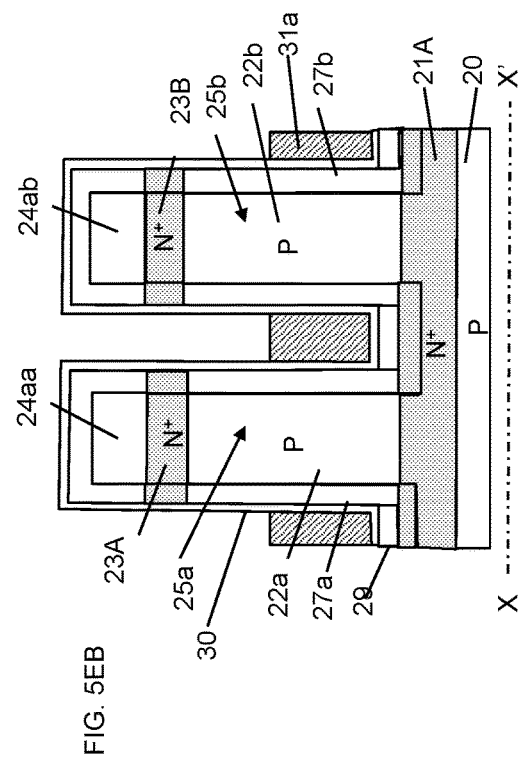

Then, a SiO$_2$ layer (not illustrated) is applied to cover the entire surface. Then, polishing is performed by a CMP (Chemical Mechanical Polishing) method so that an upper surface of the SiO$_2$ layer is positioned at the positions of the upper surfaces of the P layers 27a to 27d. Then, the SiO$_2$ layer is etched by a RIE (Reactive Ion Etching) method. Thus, as illustrated in FIGS. 5EA to 5EC, a SiO$_2$ layer 29 is formed on side surfaces of bottom portions of the P layers 27a to 27d. Then, a HfO$_2$ layer 30 serving as a gate insulating layer is formed to cover the entire surface. Then, for example, a TiN layer 31a (an example of a "first gate conductor layer" in the claims) is formed, which is a gate conductor layer surrounding a lower side surface of the HfO$_2$ layer 30.

Next, as illustrated in FIGS. 5FA to 5FC, the exposed portion of the HfO$_2$ layer 30 is etched to form a HfO$_2$ layer 30a (an example of a "first gate insulating layer" in the claims). Then, a HfO$_2$ layer 32 (an example of a "second gate insulating layer" in the claims) serving as a gate insulating layer is formed on the entire surface. Then, a TiN layer (not illustrated) whose upper surface is positioned near the positions of the lower ends of the N$^+$ layers 23A to 23D is formed so as to surround the side surface of the HfO$_2$ layer 32. Then, the entire surface is coated with a silicon nitride (SiN) film (not illustrated). Then, the SiN film is etched by the RIE method to form SiN layers 35a and 35b (examples of a "first mask material layer" in the claims) surrounding the HfO$_2$ layer 32. Then, the TiN layer is etched by using the SiN layers 35a and 35b as a mask to form TiN layers 33a and 33b (examples of a "second gate conductor layer" in the claims). The distance between the Si pillars 25a and 25b and the thickness of the SiN layer 35a are set so that the TiN layer 33a is formed so as to be continuous between the Si pillars 25a and 25b arranged in the X-X' line direction in plan view. Likewise, the distance between the Si pillars 25c and 25d and the thickness of the SiN layer 35b are set so that the TiN layer 33b is formed so as to be continuous between the Si pillars 25c and 25d arranged in the X-X' line direction in plan view. The distance between the Si pillars 25a and 25c and the distance between the Si pillars 25b and 25d are set so that the TiN layers 33a and 33b are formed apart from each other. As a result, the TiN layers 33a and 33b are formed in such a manner as to be continuous between the Si pillars 25a and 25b and between the Si pillars 25c and 25d and separated from each other between the Si pillars 25a and 25c and between the Si pillars 25b and 25d. Before the HfO$_2$ layer 32 is formed, the exposed portions of the P layers 27a to 27d may be oxidized, and then the oxidized layers may be removed. Alternatively, the HfO$_2$ layer 32 and the TiN layers 33a and 33b may be formed after the portions of the P layers 27a to 27d are removed by etching.

Figure 5G:
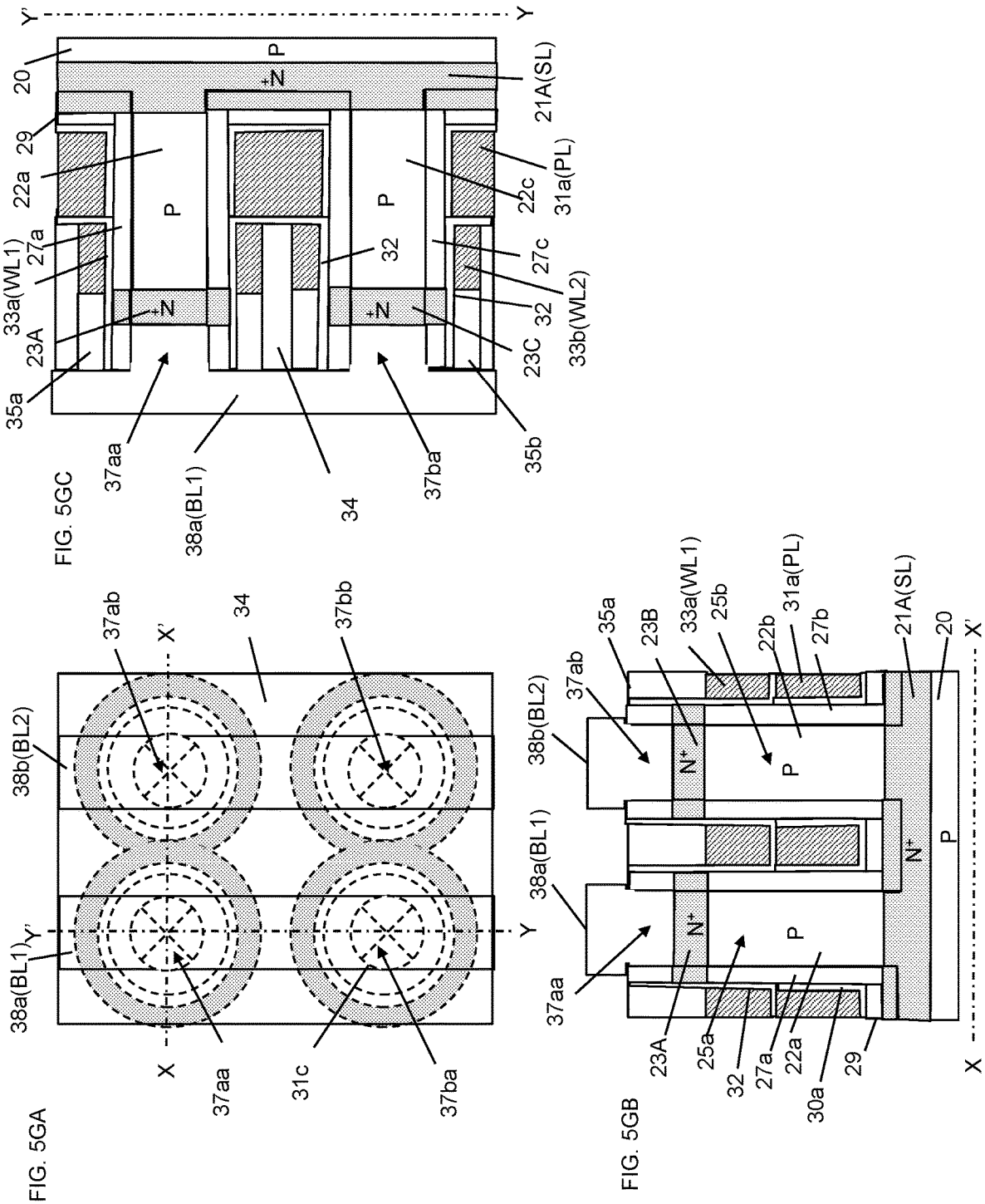
FIGS. 5GA, 5GB, and 5GC are structural diagrams illustrating the method for manufacturing the memory device including an SGT according to the first embodiment.
Figure 7A:
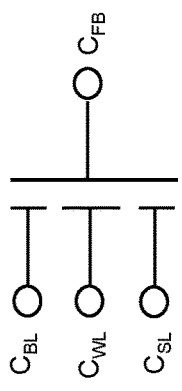
FIGS. 7A and 7B are diagrams for describing a problem in the operation of the capacitorless DRAM memory cell of the related art.
Figure 7B:
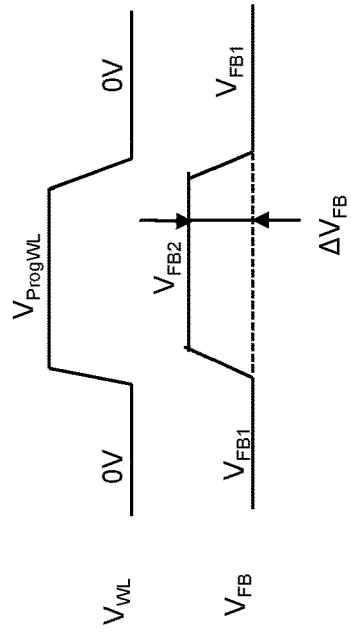

Then, the entire surface is coated with a SiO$_2$ layer (not illustrated) by the CVD method. Then, the entire surface is polished by the CMP method so that an upper surface of the SiO$_2$ layer is positioned at the positions of the upper surfaces of the mask material layers 24aa to 24bb. As a result, as illustrated in FIGS. 5GA to 5GC, a SiO$_2$ layer 34 is formed so as to surround the SiN layers 35a and 35b. Then, the mask material layers 24aa to 24bb are etched to form contact holes 37aa, 37ab, 37ba, and 37bb. Then, a conductive electrode layer 38a connected to the N$^+$ layers 23A and 23C through the contact holes 37aa and 37ba and a conductive electrode layer 38b connected to the N$^+$ layers 23B and 23D through the contact holes 37ab and 37bb are formed. The N$^+$ layer 21A is connected to a source line SL, the TiN layer 31a is connected to a plate line PL, the TiN layers 33a and 33b are connected to word lines WL1 and WL2, respectively, the N$^+$ layers 23A and 23C are connected to a bit line BL1 through the conductive electrode layer 38a, and the N$^+$ layers 23B and 23D are connected to a bit line BL2 through the conductive electrode layer 38b. As a result, dynamic flash memory cells are formed on the P-layer substrate 20.

In FIG. 1, the Si pillar 2 having a rectangular vertical cross section is used. However, the Si pillar 2 may be formed to have a trapezoidal vertical cross section shape. The portions of the Si pillar 2 surrounded by the first gate insulating layer 4a and the second gate insulating layer 4b may have different shapes such as a rectangular shape and a trapezoidal shape. In FIGS. 5AA to 5GC, a portion of the Si pillars 25a to 25d surrounded by the TiN layer 31a and a portion of the Si pillars 25a to 25d surrounded by the TiN layers 33a and 33b may have rectangular and trapezoidal shapes.

In FIG. 1, even if the first gate conductor layer 5a surrounds a portion of the first gate insulating layer 4a, the dynamic flash memory operation can be performed. Even if the first gate conductor layer 5a is divided into a plurality of conductor layers and the conductor layers are driven synchronously or asynchronously, the dynamic flash memory operation can be performed. Likewise, even if the second gate conductor layer 5b is divided into a plurality of conductor layers and the conductor layers are driven synchronously or asynchronously, the dynamic flash memory operation can be performed. In FIGS. 5AA to 5GC, the TiN layer 31a corresponding to the first gate conductor layer 5a may be divided, and the TiN layers 33a and 33b corresponding to the second gate conductor layer 5b may be divided.

In FIG. 1, the N$^+$ layer 3a may extend over the substrate 1 to serve also as a wiring conductor layer for the source line SL. Alternatively, a conductor layer such as a W layer may be connected to the N$^+$ layer 3a. In FIGS. 5AA to 5GC, a conductor layer made of metal or an alloy, such as a W layer, may be connected to the N$^+$ layer 21A outside a region where a large number of dynamic flash memory cells are formed two-dimensionally.

Even a structure in which the N$^+$ layers 3a and 3b and the P layers 7a and 7b have conductivity reversed in polarity from that described above can also implement the dynamic flash memory operation. In this case, electrons are majority carriers in the Si pillar 2. Accordingly, the electron group generated by impact ionization is stored in the channel region 8, and the "1" state is set. The same applies to the relationship between the N$^+$ layers 21A and 23A to 23D and the P layers 22a to 22d and 27a to 27d in FIGS. 5AA to 5GC.

In FIGS. 5DA to 5DC, heat treatment is performed to diffuse a donor impurity from the N$^+$ layers 21a and 23a to 23d into the P layer 27 to form the N$^+$ layers 21A and 23A to 23D. Alternatively, the N$^+$ layers 21A and 23A to 23D may be formed by a subsequent thermal process.

In FIGS. 5EA to 5EC, the TiN layer 31a is formed so as to be continuous across the Si pillars 25a to 25d. Alternatively, in the step of forming the TiN layers 33a and 33b serving as word lines, etching may be performed up to the TiN layer 31a by using the SiN layers 35a and 35b as a mask to form a TiN layer connected to a plate line connected between the Si pillars 25a and 25b and also connected to a plate line connected between the Si pillars 25c and 25d.

In FIGS. 5FA to 5FC, etching is performed up to the HfO$_2$ layer 32 by using the SiN layers 35a and 35b as a mask. Alternatively, the HfO$_2$ layer 32 and the TiN layer 31a may further be etched. As a result, a TiN layer connected to a plate line having the same shape as the TiN layers 33a and 33b connected to the word lines WL1 and WL2 in plan view is formed. This also allows a normal dynamic flash memory operation to be performed.

In FIG. 1, the first gate conductor layer 5a is connected to the plate line PL, and the second gate conductor layer 5b is connected to the word line WL. Alternatively, the first gate conductor layer 5a may be connected to the word line WL, and the second gate conductor layer 5b may be connected to the plate line PL. This also allows a normal dynamic flash memory operation to be performed. The same applies to the dynamic flash memory illustrated in FIGS. 5AA to 5GC.

This embodiment provides the following features.
(Feature 1)

In the cell illustrated in FIG. 1, in plan view, the logic "1" state is set by the presence of the hole group held in the channel region 8. The hole group is mainly accumulated in the P layer 7a in the central portion of the channel region 8. As the volume of the P layer 7a increases, the number of holes that can be held increases. This leads to stable retention characteristics. In this embodiment, in contrast, as illustrated in FIGS. 5BA to 5BC and FIGS. 5CA to 5CC, after the P layers 22a to 22b are formed, the P layer 27 is coated by the ALD method, thereby increasing the area of the Si pillars 25a to 25d in plan view. For example, in plan view, when the diameters of the P layers 25a to 25d are increased to the maximum of patterning by using a lithography method, the formation of the P layer 27 can further increase the diameters of the Si pillars 25a to 25d. As a result, the retention characteristics can further be improved. This is also effective to reduce the area of the cells. As a result, high integration of the dynamic flash memory can be achieved.

(Feature 2)

In FIG. 1, the hole group generated by the impact ionization phenomenon is mainly stored in the P layer 7a (corresponding to the P layers 22a to 22d in FIGS. 5GA to 5GC). Setting the acceptor impurity concentration of the P layer 7a to be higher than that of the P layer 7b (corresponding to the P layers 27a to 27d in FIGS. 5GA to 5GC) causes the electronic current flowing between the N⁺ layers 3a and 3b in the read operation to flow through the P layer 7b. Accordingly, in the read operation, the channel of the electronic current in the P layer 7b and the floating body in the P layer 7a where the hole group 11 is stored are separated from each other, and a more stable floating body voltage is maintained. This enables a stable operation of the dynamic flash memory, leading to high performance.

(Feature 3)

As illustrated in FIGS. 5DA to 5DC, heat treatment is performed to diffuse a donor impurity from the N⁺ layers 21a and 23a to 23d into the P layer 27 to form the N⁺ layers 21A and 23A to 23D. As a result, the P layers 22a to 22d and the P layers 27a to 27d, which are channel regions, are isolated among the Si pillars 25a to 25d by the N⁺ layer 21A. The N⁺ layers 23A to 23D are formed so as to spread over the entire cross sections of the Si pillars 25a to 25d, thus making it possible to prevent short-circuit failure between the conductive electrode layers 38a and 38b and the P layers 22a to 22d and 27a to 27d.

Other Embodiments

The first gate conductor layers 5a and 31a connected to the plate line PL may be formed of a single conductor material layer or a combination of multiple conductor material layers. Likewise, the second gate conductor layers 5b, 33a, and 33b connected to the word line WL may be formed of a single conductor material layer or a combination of multiple conductor material layers. The outer side of each gate conductor layer may be connected to a wiring metal layer such as W. The same applies to other embodiments according to the present invention.

In FIG. 1, the vertical length of the first gate conductor layer 5a to which the plate line PL is connected is set to be longer than the vertical length of the second gate conductor layer 5b to which the word line WL is connected such that $C_{PL} > C_W$ is met. However, only addition of the plate line PL results in a reduction in the capacitive coupling ratio of the word line WL to the channel region 8 ($C_{WL}/(C_{PL}+C_{WL}+C_{BL}+C_{SL})$). As a result, the potential variation $\Delta V_{FB}$ of the channel region 8 of the floating body is reduced.

In the description of the first embodiment, as the voltage of the plate line PL, for example, a fixed voltage of 2 V may be applied regardless of the operation mode. As the voltage of the plate line PL, for example, 0 V may be applied only at the time of erasing. The voltage of the plate line PL may be a fixed voltage or a voltage that changes with time as long as the voltage satisfies a condition in which a dynamic flash memory operation can be performed.

The Si pillars 2 and 25a to 25d having a circular shape in plan view may have a shape other than a circular shape, such as an elliptical shape or a shape elongated in one direction.

In the description of this embodiment, at the time of the erase operation, the source line SL is negatively biased to extract the hole group in the channel region 8, which is the floating body FB. The erase operation may be performed with the bit line BL negatively biased instead of the source line SL or with both the source line SL and the bit line BL negatively biased. Alternatively, the erase operation may be performed under other voltage conditions. The same applies to other embodiments according to the present invention.

In FIG. 1, an N-type or P-type impurity layer may be disposed between the N⁺ layer 3a and the Si pillar 2. An N-type or P-type impurity layer may be disposed between the N⁺ layer 3b and the Si pillar 2. The same applies to FIGS. 5GA to 5GC.

In FIG. 1, the P layer 7a and the P layer 7b may be formed as different semiconductor material layers. The same applies to FIGS. 5GA to 5GC.

In FIG. 1, the N⁺ layers 3a and 3b may be formed of layers made of Si or any other semiconductor material containing a donor impurity. The N⁺ layer 3a and the N⁺ layer 3b may be formed as different semiconductor material layers. The same applies to FIGS. 5GA to 5GC.

In FIGS. 5AA to 5GC, the Si pillars 25a to 25d are arranged in a square lattice shape in plan view. Alternatively, the Si pillars 25a to 25d may be arranged in an oblique lattice shape or a zigzag shape.

In FIG. 1, one dynamic flash memory cell is formed on the substrate 1. Alternatively, a plurality of dynamic flash memory cells may be formed in the vertical direction. The same applies to FIGS. 5AA to 5GC.

In FIG. 1, a P layer, an SOI, or a multi-layer well may be used as the substrate 1. Likewise, in FIGS. 5AA to 5GC, an SOI or a multi-layer well may be used in place of the P-layer substrate 20.

Various embodiments and modifications can be made to the present invention without departing from the broad spirit and scope of the present invention. The embodiment described above is for explaining an example of the present invention, and do not limit the scope of the present invention. The embodiment and modifications described above can be combined as desired. Some of the components may be removed as necessary from the embodiment described above to form other embodiments within scope of the technical idea of the present invention.

INDUSTRIAL APPLICABILITY

A method for manufacturing a memory device using a semiconductor element according to the present invention provides a high-density and high-performance dynamic flash memory.

The invention claimed is:

1. A method for manufacturing a memory device using a semiconductor element, the memory device including a first gate conductor layer, a second gate conductor layer, a first impurity layer, and a second impurity layer such that voltages to be applied to the first gate conductor layer, the second gate conductor layer, the first impurity layer, and the second impurity layer are controlled to perform a data write operation, a data read operation, and a data erase operation, the method comprising the steps of:

forming a first semiconductor layer standing on a substrate in a vertical direction to the substrate;

forming a second semiconductor layer surrounding the first semiconductor layer to form a first semiconductor pillar composed of the first semiconductor layer and the second semiconductor layer;

forming a first gate insulating layer surrounding a lower portion of the second semiconductor layer;

forming the first gate conductor layer so as to surround the first gate insulating layer;

removing or leaving a portion of the second semiconductor layer above the first gate conductor layer in the vertical direction;

forming a second gate insulating layer connected to the first gate insulating layer and surrounding the second semiconductor layer or an upper portion of the first semiconductor layer;

forming the second gate conductor layer so as to surround the second gate insulating layer and so as to be separated from the first gate conductor layer;

forming the first impurity layer at a bottom portion of the first semiconductor pillar before or after forming the first semiconductor pillar; and forming the second impurity layer at a top portion of the first semiconductor pillar before or after forming the first semiconductor pillar.

2. The method for manufacturing a memory device using a semiconductor element according to claim 1, further comprising the steps of:

forming a third impurity layer on the substrate before forming the first semiconductor layer; and forming the first impurity layer by, after forming the first semiconductor pillar, diffusing majority carrier impurity atoms from the third impurity layer into the first semiconductor layer and the second semiconductor layer by a thermal process.

3. The method for manufacturing a memory device using a semiconductor element according to claim 1, further comprising the steps of:

forming a fourth impurity layer on top of the first semiconductor layer; and forming the second impurity layer by, after forming the first semiconductor pillar, diffusing majority carrier impurity atoms from the fourth impurity layer into the first semiconductor layer and the second semiconductor layer, in a case where the second semiconductor layer is left, by a thermal process.

4. The method for manufacturing a memory device using a semiconductor element according to claim 1, further comprising the step of:

removing part or entirety of an exposed portion of the second semiconductor layer before forming the second gate insulating layer.

5. The method for manufacturing a memory device using a semiconductor element according to claim 1, wherein the first semiconductor layer is formed such that the first semiconductor layer has a higher impurity concentration than the second semiconductor layer.

6. The method for manufacturing a memory device using a semiconductor element according to claim 1, further comprising the steps of:

after forming the second gate insulating layer, forming a first conductor layer surrounding the second gate insulating layer such that an upper surface of the first conductor layer is positioned near a lower end of the second impurity layer;

forming a first mask material layer on top of the first conductor layer so as to surround at least the second impurity layer; and etching the first conductor layer by using the first mask material layer as a mask to form the second gate conductor layer.

7. The method for manufacturing a memory device using a semiconductor element according to claim 6, further comprising the steps of:

forming a second conductor layer surrounding the first gate insulating layer and having an upper surface located on an upper surface of the first gate conductor layer; and etching the first conductor layer, the second gate insulating layer, and the second conductor layer by using the first mask material layer as a mask, wherein the second conductor layer subjected to etching serves as the first gate conductor layer.

8. The method for manufacturing a memory device using a semiconductor element according to claim 3, further comprising the steps of:

forming a second mask material layer on top of the fourth impurity layer;

forming the fourth impurity layer and the first semiconductor layer by using the second mask material layer as an etching mask;

etching the second mask material layer to form a first contact hole; and forming a first conductive wiring layer connected to the second impurity layer through the first contact hole.

9. The method for manufacturing a memory device using a semiconductor element according to claim 1, wherein the first impurity layer is connected to a source line, the second impurity layer is connected to a bit line, the first gate conductor layer is connected to a first drive control line, and the second gate conductor layer is connected to a word line.

10. The method for manufacturing a memory device using a semiconductor element according to claim 1, wherein the first gate conductor layer, the second gate conductor layer, the first impurity layer, and the second impurity layer are formed such that the data write operation for holding, in the first semiconductor pillar, a hole group or an electron group serving as majority carriers in the first semiconductor pillar is performed, the hole group or the electron group being formed by an impact ionization phenomenon or a gate induced drain leakage current, and such that the voltages to be applied to the first gate conductor layer, the second gate conductor layer, the first impurity layer, and the second impurity layer are controlled to perform the data erase operation for discharging the hole group or the electron group serving as the majority carriers in the first semiconductor pillar from within the first semiconductor pillar.

* * * * *